United States Patent
You et al.

(10) Patent No.: US 9,466,248 B2
(45) Date of Patent: Oct. 11, 2016

(54) LIQUID CRYSTAL DISPLAY AND METHOD OF DRIVING THE SAME

(71) Applicant: Samsung Display Co., Ltd., Yongin (KR)

(72) Inventors: Hye-ran You, Yongin-si (KR);
Seung-beom Park, Seoul (KR);
Yoon-sung Um, Yongin-si (KR);
Jin-won Park, Suwon-si (KR);
Hee-wook Do, Cheonan-si (KR); Hoon Kim, Ansan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

(21) Appl. No.: 13/966,864

(22) Filed: Aug. 14, 2013

(65) Prior Publication Data

US 2013/0328850 A1 Dec. 12, 2013

Related U.S. Application Data

(60) Continuation of application No. 13/081,149, filed on Apr. 6, 2011, now Pat. No. 8,520,160, which is a division of application No. 12/164,381, filed on Jun. 30, 2008, now Pat. No. 7,940,346.

(30) Foreign Application Priority Data

Jul. 24, 2007 (KR) .................. 10-2007-0074127

(51) Int. Cl.
| | |
|---|---|
| G09G 3/36 | (2006.01) |
| G09G 5/10 | (2006.01) |
| G06F 3/038 | (2013.01) |
| G09G 5/00 | (2006.01) |
| G02F 1/1362 | (2006.01) |
| G11C 19/18 | (2006.01) |
| G02F 1/139 | (2006.01) |
| G02F 1/1343 | (2006.01) |

(52) U.S. Cl.
CPC ............ G09G 3/36 (2013.01); G02F 1/13624 (2013.01); G09G 3/3659 (2013.01);
(Continued)

(58) Field of Classification Search
CPC .............. G09G 2310/0251; G09G 3/3648; G09G 3/3233; G09G 3/3614; G09G 3/3677
See application file for complete search history.

(56) References Cited

U.S. PATENT DOCUMENTS

2002/0089813 A1* 7/2002 Yamamoto ........... G09G 3/3659
361/328
2004/0183792 A1* 9/2004 Takada et al. ............... 345/204

(Continued)

OTHER PUBLICATIONS

Non-Final Office Action of U.S. Appl. No. 12/164,381 issued on Aug. 5, 2010.

(Continued)

*Primary Examiner* — Alexander Eisen
*Assistant Examiner* — Nan-Ying Yang
(74) *Attorney, Agent, or Firm* — H.C. Park & Associates, PLC

(57) ABSTRACT

A LCD and a method of driving the LCD are provided. The LCD includes first and second gate lines extending in a first direction, a data line insulated from the first gate line and crossing the first gate line, a pixel electrode including first and second sub-pixel electrodes, the pixel electrode being disposed in a pixel having a long side in the first direction, a first thin film transistor (TFT) connected to the first gate line, the data line, and the first sub-pixel electrode, a second TFT connected to the first gate line, the data line, and the second sub-pixel electrode, and a third TFT connected to the second gate line, the second sub-pixel electrode, and a charge-sharing capacitor, the charge-sharing capacitor sharing a data voltage applied to the second sub-pixel electrode.

10 Claims, 19 Drawing Sheets

(52) U.S. Cl.
CPC ......... *G09G 3/3677* (2013.01); *G11C 19/184* (2013.01); *G02F 1/1393* (2013.01); *G02F 2001/134354* (2013.01); *G09G 3/3614* (2013.01); *G09G 2300/0443* (2013.01); *G09G 2330/023* (2013.01)

(56) References Cited

U.S. PATENT DOCUMENTS

| | | | |
|---|---|---|---|
| 2005/0001805 A1* | 1/2005 | Jeon et al. | 345/92 |
| 2005/0036091 A1 | 2/2005 | Song | |
| 2006/0215066 A1* | 9/2006 | Ueda et al. | 349/38 |
| 2006/0290827 A1 | 12/2006 | Kihara et al. | |
| 2007/0058123 A1 | 3/2007 | Um et al. | |
| 2007/0165149 A1 | 7/2007 | Kim et al. | |
| 2008/0024689 A1 | 1/2008 | Ahn | |

OTHER PUBLICATIONS

Notice of Allowance of U.S. Appl. No. 12/164,381 issued on Dec. 30, 2010.

Non-Final Office Action of U.S. Appl. No. 13/081,149 issued on Jan. 24, 2013.

Notice of Allowance of U.S. Appl. No. 13/081,149 issued on May 15, 2013.

* cited by examiner

FIG. 9
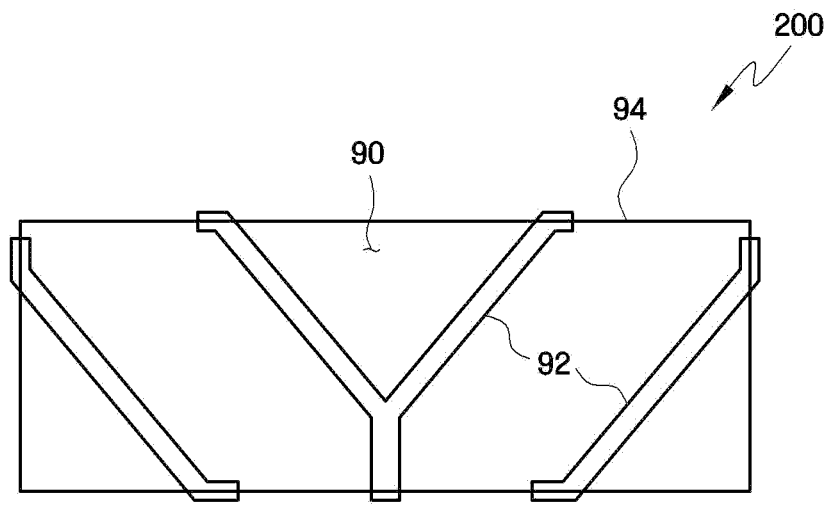
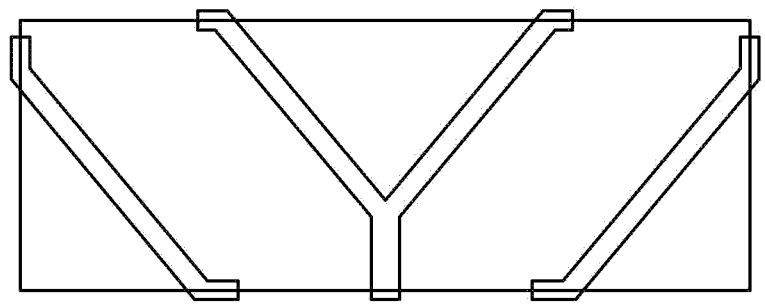
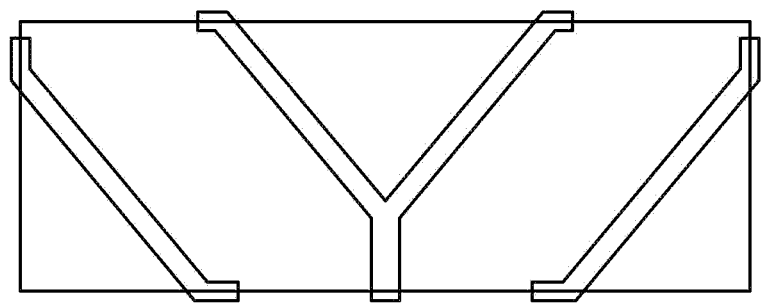

LIQUID CRYSTAL DISPLAY AND METHOD OF DRIVING THE SAME

CROSS REFERENCE TO RELATED APPLICATION

This application is a continuation of U.S. patent application Ser. No. 13/081,149, filed on Apr. 6, 2011, and claims priority from and the benefit of U.S. patent application Ser. No. 12/164,381, filed on Jun. 30, 2008, and of Korean Patent Application No. 10-2007-0074127, filed on Jul. 24, 2007, which are hereby incorporated by reference for all purposes as if fully set forth herein.

BACKGROUND OF THE INVENTION

1. Field of the Invention

The present invention relates to a display apparatus and a method of driving the same, and, more particularly, to a liquid crystal display ("LCD") and a method of driving the same.

2. Discussion of the Background

LCDs are widely used flat panel displays. An LCD may include two substrates including field-generating electrodes, such as pixel electrodes and a common electrode, and a liquid crystal (LC) layer interposed therebetween. LCDs display images by applying voltages to the field-generating electrodes to generate an electric field in the LC layer, which changes the orientations of LC molecules in the LC layer to adjust polarization of incident light.

A vertical alignment (VA) mode LCD, in which LC molecules are aligned such that their long axes are perpendicular to the substrates in the absence of an electric field, has a high contrast ratio and a wide reference viewing angle. The reference viewing angle is defined as the viewing angle at which the contrast ratio is equal to 1:10 or as the limit angle for the inversion in luminance between the grays.

A wide viewing angle of the VA mode LCD may be realized by, for example, having cutouts in the field-generating electrodes and protrusions on the field-generating electrodes. The cutouts and the protrusions can alter the tilt directions of the LC molecules. The LC molecules may have various tilt directions due to the cutouts and the protrusions, which may widen the reference viewing angle.

However, VA mode LCDs have relatively poor lateral visibility as compared to frontal visibility. For example, a patterned VA (PVA) mode LCD having cutouts may display an image that becomes brighter at the sides thereof, thereby resulting in poor lateral visibility.

In addition, as the resolution of the LCD increases, it may be necessary to increase the number of data lines and data driving chips. Therefore, production costs may increase and it may be difficult to make a small LCD.

SUMMARY OF THE INVENTION

The present invention provides an LCD that may have improved lateral visibility and lower production costs.

The present invention also provides a method of driving the LCD that may improve lateral visibility and reduce production costs.

Additional features of the invention will be set forth in the description which follows, and in part will be apparent from the description, or may be learned by practice of the invention.

The present invention discloses an LCD including a first gate line and a second gate line extending in a first direction, a data line insulated from the first gate line and crossing the first gate line, a pixel electrode including a first sub-pixel electrode and a second sub-pixel electrode, the pixel electrode being disposed in a pixel having a long side in the first direction, a first thin film transistor (TFT) connected to the first gate line, the data line, and the first sub-pixel electrode, a second TFT connected to the first gate line, the data line, and the second sub-pixel electrode, and a third TFT connected to the second gate line, the second sub-pixel electrode, and a charge-sharing capacitor, the charge-sharing capacitor sharing a data voltage applied to the second sub-pixel electrode.

The present invention also discloses an LCD including a liquid crystal panel assembly, a signal controller supplying a first scan start signal and a second scan start signal that have a phase difference, and a gate driver enabled by the first scan start signal and the second scan start signal to sequentially output a first gate-on signal and a second gate-on signal to the liquid crystal panel assembly. Here, the liquid crystal panel assembly includes a first gate line and a second gate line extending in a first direction, a data line insulated from the first gate line and crossing the first gate line, a pixel electrode that includes a first sub-pixel electrode and a second sub-pixel electrode, the pixel electrode being disposed in a pixel having a long side in the first direction, a first thin film transistor (TFT) connected to the first gate line, the data line, and the first sub-pixel electrode, a second TFT connected to the first gate line, the data line, and the second sub-pixel electrode, and a third TFT connected to the second gate line, the second sub-pixel electrode, and a charge-sharing capacitor, the charge-sharing capacitor sharing a data voltage applied to the second sub-pixel electrode.

The present invention also discloses a method of driving an LCD includes supplying a first scan start signal and a second scan start signal that have a phase difference, sequentially outputting a first gate-on signal and a second gate-on signal to a plurality of gate lines, the first gate-on signal and the second gate-on signal enabled by the first scan start signal and the second scan start signal, respectively, precharging a pixel electrode connected to each gate line, the pixel electrode including a pair of sub-pixel electrodes, charging the pair of sub-pixel electrodes with a data voltage, and sharing the data voltage so that each sub-pixel electrode of the pair of sub-pixel electrodes has a different voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 9 is a layout of an upper display panel of an LCD according to an exemplary embodiment of the present invention.

DETAILED DESCRIPTION OF THE ILLUSTRATED EMBODIMENTS

Figure 1:
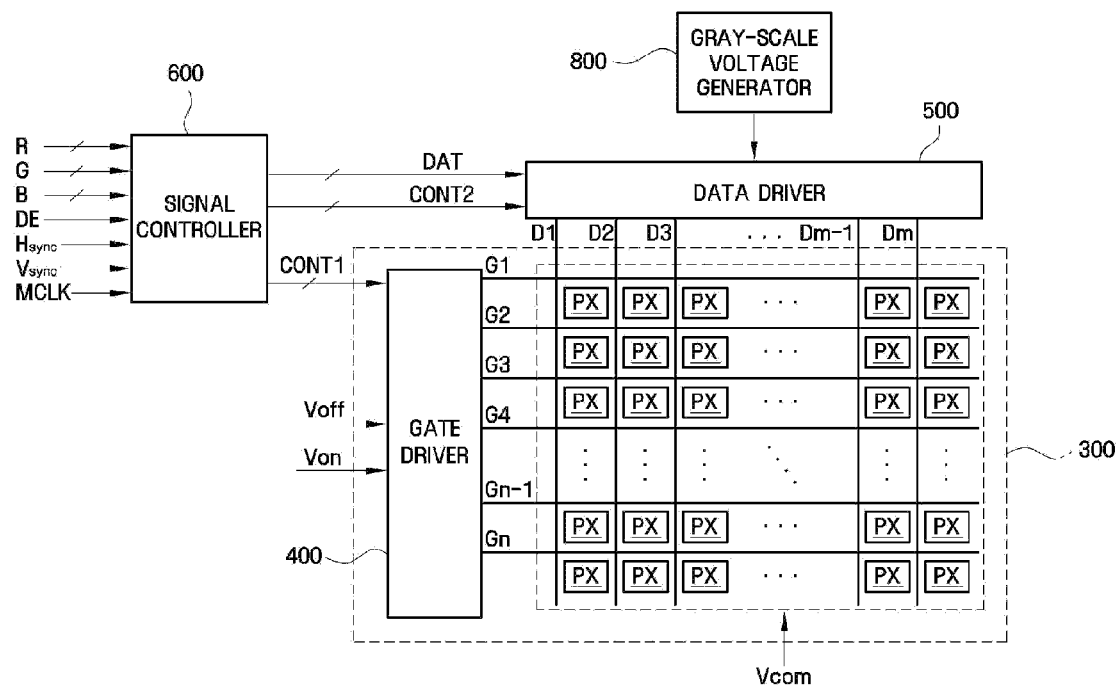
FIG. 1 and FIG. 2 are block diagrams of an LCD according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and the relative sizes of layers and regions may be exaggerated for clarity. Like reference numerals in the drawings denote like elements.

It will be understood that when an element is referred to as being "on," "connected to", or "coupled to" another element, it can be directly on, directly connected to, or directly coupled to the other element or intervening elements may be present there between. In contrast, when an element is referred to as being "directly on", "directly connected to", or "directly coupled to" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

A liquid crystal display ("LCD") according to an exemplary embodiment of the present invention will hereinafter be described in more detail with reference to the accompanying drawings.

Figure 2:
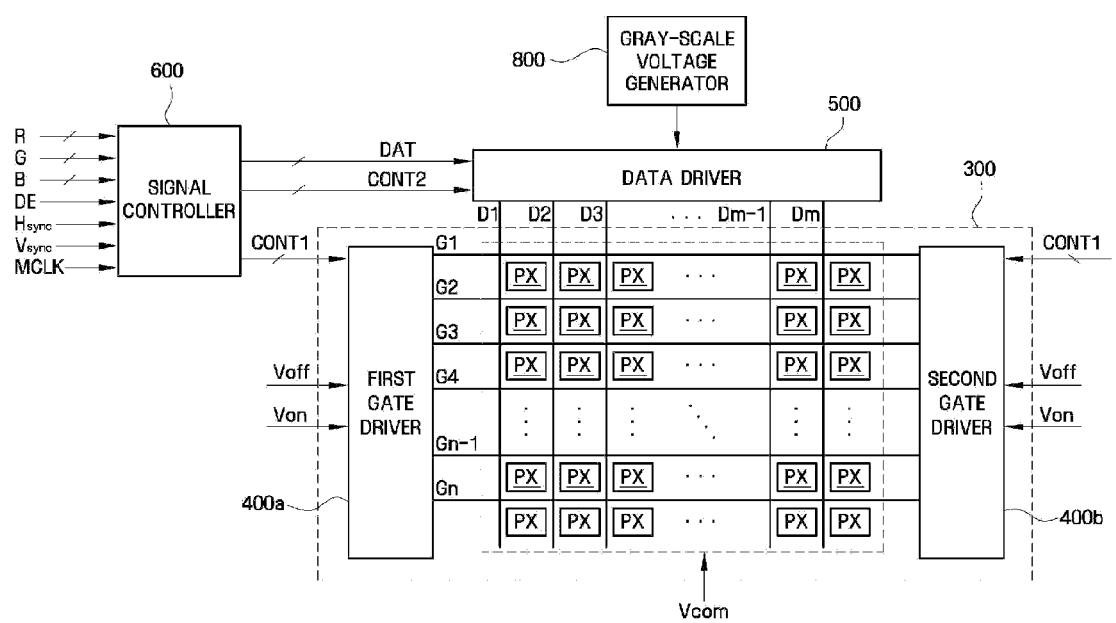

Referring to FIG. 1 and FIG. 2, an LCD according to an exemplary embodiment of the present invention includes a liquid crystal panel assembly 300, a data driver 500 and a gate driver 400 (or a pair of gate drivers 400a and 400b) connected to the liquid crystal panel assembly 300, a gray-scale voltage generator 800 connected to the data driver 500, and a signal controller 600 to control the gate driver 400 (or the gate drivers 400a and 400b) and the data driver 500.

The liquid crystal panel assembly 300 includes a plurality of display signal lines and a plurality of pixels PX connected to the display signal lines and arranged in a matrix format. Here, the liquid crystal panel assembly 300 may include a lower display panel and an upper display panel that face each other with a liquid crystal layer interposed therebetween.

The display signal lines are disposed on the lower display panel and include a plurality of gate lines G1 through Gn that transmit a gate signal, and a plurality of data lines D1 through Dm that transmit a data signal. The gate lines G1 through Gn extend in a transverse direction and are parallel to one another, while the data lines D1 through Dm extend in a longitudinal direction and are parallel to one another.

Each pixel PX includes a switching device, a liquid crystal capacitor, and a storage capacitor. The switching device is connected to one of the gate lines G1 through Gn and one of the data lines D1 through Dm. The liquid crystal capacitor is connected to the switching device. The storage capacitor is connected in parallel to the switching device. Here, the storage capacitor may be omitted.

A switching device Q of the pixel PX includes a thin film transistor (TFT) disposed on the lower display panel and is a three-end portion device including a control end portion connected to one of the gate lines G1 through Gn, an input end portion connected to one of the data lines D1 through Dm, and an output end portion connected to a liquid crystal capacitor.

The gate driver 400 (or the gate drivers 400a and 400b) is connected to the gate lines G1 through Gn and applies a gate signal consisting of a gate-on voltage Von and a gate-off voltage Voff applied from an external circuit to the gate lines G1 through Gn. In detail, referring to FIG. 1, the gate driver 400 is located on one side of the liquid crystal panel assembly 300 and is connected to all of the gate lines G1 through Gn. Referring to FIG. 2, the gate drivers 400a and 400b are located on the left and right sides, respectively, of the liquid crystal panel assembly 300 and are connected to the gate lines G1 through Gn. In the case of a large LCD, it may not be enough for one gate driver 400 to apply the gate-on voltage Von or the gate-off voltage Voff to the ends of the gate lines G1 through Gn. Therefore, a pair of the gate drivers 400a and 400b may be connected to both ends of the gate lines G1 through Gn, respectively. The gate driver 400 (or the gate drivers 400a and 400b) may be integrated into the lower display panel of the liquid crystal panel assembly 300 as an integrated circuit.

The gray-scale voltage generator 800 generates a gray-scale voltage that is related to the transparency of the pixel PX. The gray-scale voltage is provided to each pixel PX. The gray-scale voltages may include positive polarity voltages and negative polarity voltages with respect to the common voltage Vcom.

The data driver 500 is connected to the data lines D1 through Dm of the liquid crystal panel assembly 300 and applies the gray-scale voltage generated by the gray-scale voltage generator 800 to the pixels PX as a data voltage. Here, if the gray-scale voltage generator 800 is designed to provide only a reference gray-scale voltage, instead of providing voltages for all gray scales, the data driver 500 generates a plurality of reference voltages for all gray scales by dividing the reference gray scale and selects one of the reference voltages as a data voltage.

The gate driver 400 (or the gate drivers 400a and 400b) or the data driver 500 may be integrated on the liquid crystal panel assembly 300 together with the display signal lines G1 through Gn and D1 through Dm and a switching device, like a TFT. Alternatively, the gate driver 400 (or the gate drivers 400a and 400b) or the data driver 500 may be mounted on a flexible printed circuit film (not shown), and then the resulting structure may be mounted on the liquid crystal panel assembly 300 as a tape carrier package.

The signal controller 600 controls the gate driver 400 (or the gate drivers 400a and 400b) and the data driver 500.

The signal controller 600 receives input image signals (R, G, B) and input control signals to control the displaying of the input image signals, for example, a vertical synchronization signal Vsync, a horizontal synchronization signal Hsync, a main clock signal MCLK, and a data enable signal DE, from an external graphics controller (not shown). The signal controller 600 appropriately processes the input image signals and the input control signals according to the operating conditions of the liquid crystal panel assembly 300, generates a gate control signal CONT1 and a data control signal CONT2, transmits the gate control signal CONT1 to the gate driver 400 (or the gate drivers 400a and 400b), and transmits the data control signal CONT2 and the processed image signal DAT to the data driver 500.

The gate control signal CONT1 includes a scanning initiation signal STV to initiate scanning and at least one clock signal to control when to output the gate-on voltage Von. The gate control signal CONT1 may also include an output enable signal OE to define the duration of the gate-on voltage Von. Here, the clock signal included in the gate control signal CONT1 may be used as a selection signal SE.

The data control signal CONT2 includes a horizontal synchronization signal STH to inform the data driver 500 of a start of data transmission for a group of pixels, a load signal LOAD to instruct the data driver 500 to apply the data voltages to the data lines D1 through Dm, and a data clock signal HCLK. The data control signal CONT2 may also include an inversion signal RVS to reverse the polarity of the data voltages with respect to the common Vcom.

In response to the data control signal CONT2 transmitted by the signal controller 600, the data driver 500 receives image data DAT for the pixels PX, selects a gray-scale voltage for the image data DAT, converts the image data DAT into a data voltage, and applies the data voltage to one of the data lines D1 through Dm corresponding to the pixels PX.

In response to the gate control signal CONT1 transmitted by the signal controller 600, the gate driver 400 (or the gate drivers 400a and 400b) applies the gate-on voltage Von to one of the gate lines G1 through Gn, so that the switching device connected to the gate line to which the gate-on voltage Von is applied is turned on. Accordingly, the data voltage applied via the data line is applied to the pixel PX via the switching device.

A difference between the data voltage applied to the pixel PX and the common voltage Vcom is represented as a voltage charged across the LC capacitor, which is referred to as a pixel voltage. The orientations of liquid crystal molecules in the LC layer depend on the magnitude of the pixel voltage, and molecular orientations of the LC molecules determine the polarization of light passing through the LC layer. A polarizer or polarizers transmits polarized light.

In an LCD according to an exemplary embodiment of the present invention, a data voltage is applied to a pair of sub-pixels of the pixel PX when a gate-on voltage is applied to the gate line, and then the data voltage applied to one of a pair of the sub-pixels decreases due to a charge-sharing process when a gate-on voltage is applied to a neighboring gate line. Since a different data voltage is applied to each of the pair of sub-pixel, respectively, a gamma curve for the pixel PX including the sub-pixels may be obtained by synthesizing the gamma curves for the sub-pixels. It may be possible to improve lateral visibility by determining data voltages for the respective sub-pixels due to the charge-sharing process so that a synthetic gamma curve obtained from the front of an LCD is similar to a reference gamma curve for the front of the LCD, and a synthetic gamma curve obtained from either side of the LCD is as similar as possible to the reference gamma curve.

The gate driver 400 (or the gate drivers 400a and 400b) is described below in greater detail with reference to FIG. 3 and FIG. 4. Since the gate driver 400 of FIG. 1 is substantially same as the gate drivers 400a and 400b of FIG. 2, the gate driver 400 of FIG. 1 will be described for brevity. In addition, in this exemplary embodiment, a case where the gate driver is integrated into the lower display panel of the liquid crystal panel assembly as an integrated circuit will be described.

Figure 3:
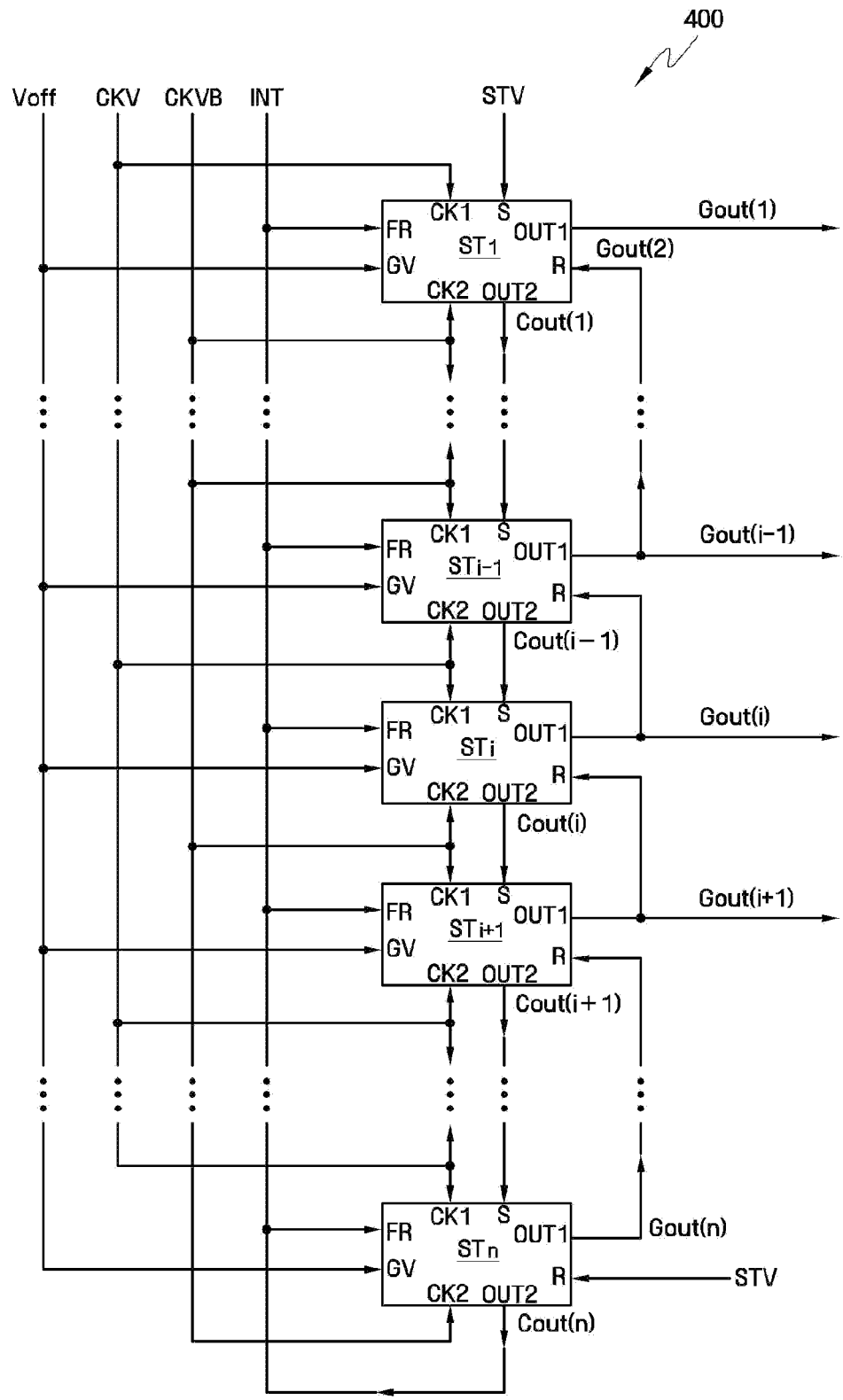
FIG. 3 is a block diagram of the gate driver shown in FIG. 1.

Referring to FIG. 3, the gate driver 400 includes a plurality of cascade-connected stages ST1 through STn. Each stage may have an amorphous silicon (a-Si) thin film transistor (TFT) disposed on the LC panel assembly to output each gate signal.

Each stage ST1-STi+1, except for the last stage STn, outputs an output gate signal Gout(1)-Gout(i+1), respectively. The gate-off voltage Voff, a clock signal CKV, a clock bar signal CKVB, and an initialization signal INT are input in parallel to each respective stage ST1-STn. The initialization signal INT may be supplied from the clock generator.

Each stage ST1-STn may have a first clock terminal CK1, a second clock terminal CK2, a set terminal S, a reset terminal R, a power supply terminal GV, a frame reset terminal FR, a gate output terminal OUT1, and a carry output terminal OUT2.

For example, the carry signal Cout(i−1) of the previous stage STi−1 is input to the set terminal S of a stage STi connected to a $i^{th}$ gate line, and a gate signal Gout(i+1) of a next stage STi+1 is input to the reset terminal R of the stage STi. The first clock signal CKV and the first clock bar signal CKVB are input to the first clock terminal CK1 and the second clock terminal CK2, respectively, and the gate-off voltage Voff is input to the power supply terminal GV. The initialization signal INT or the carry signal Cout(n) of the last stage STn is input to the frame reset terminal FR. The gate output terminal OUT1 outputs a gate signal Gout(i), and the carry signal output terminal OUT2 outputs a carry signal Cout(i).

However, the scan start signal STV, instead of the carry signal output from the previous stage, is input to the set terminal S of the first stage ST1, and the scan start signal STV, instead of the gate signal output from the next stage, is input to the reset terminal of the last stage STn.

Hereinafter, the exemplary stage STi shown in FIG. 3 is described below in greater detail with reference to FIG. 4.

Figure 4:
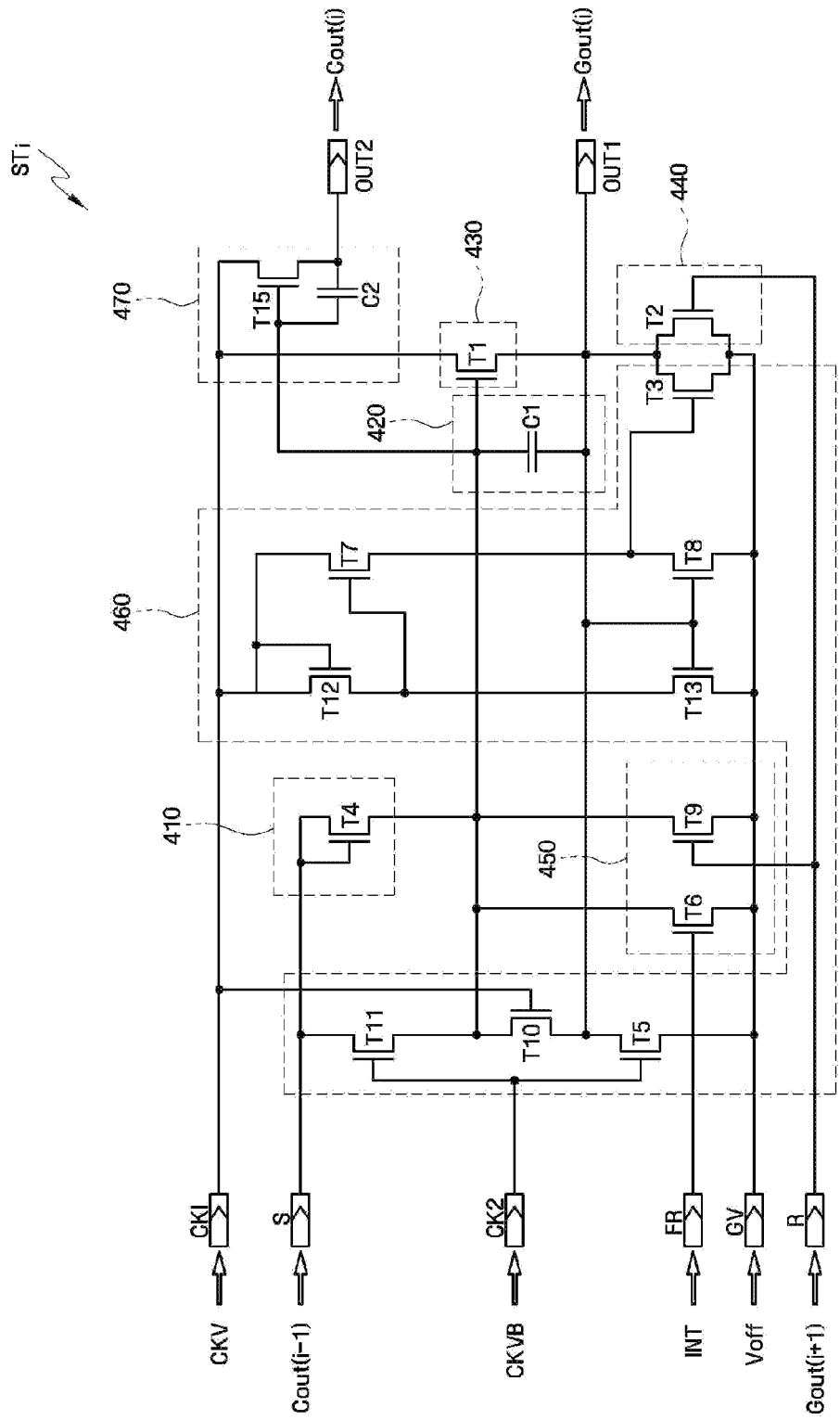
FIG. 4 is a circuit diagram of stages in the gate driver shown in FIG. 3.

Referring to FIG. 4, the stage STi includes a buffer unit 410, a charging unit 420, a pull-up unit 430, a carry-signal generator 470, a pull-down unit 440, a discharging unit 450, and a holding unit 460.

The buffer unit 410 includes a transistor T4 having its drain and its gate connected to each other, and supplies the carry signal Cout(i−1) of the previous stage STi−1 to the charging unit 420, the carry-signal generator 470, and the pull-up unit 430. Here, the carry signal Cout(i−1) of the previous stage STi−1 has been input through the set terminal S of the stage STi.

The charging unit 420 includes a capacitor C1 having a first terminal connected to the source of transistor T4 in the buffer unit 410, to the pull-up unit 430, and to the discharging unit 450, and a second terminal connected to a gate output terminal OUT1. The charging unit 420 is supplied with and charged by the carry signal Cout(i−1) of the previous stage STi−1.

The pull-up unit 430 includes a transistor T1 having its drain connected to the first clock terminal CK1, its gate connected to a first terminal of capacitor C1 in charging unit 420, and its source connected to the second terminal of capacitor C1 and to the gate output terminal OUT1. While the capacitor C1 of the charging unit 420 is charged, the transistor T1 is turned on, so that the first clock signal CKV applied through the first clock terminal CK1 is supplied as the gate signal Gout(i) through the gate output terminal OUT1.

The carry-signal generator 470 includes a transistor T15 having its drain connected to the first clock terminal CK1, its source connected to the gate output terminal OUT1, and its gate connected to the buffer unit 410, and a capacitor C2 connected to the gate and the source. The capacitor C2 is supplied with the carry signal Cout(i−1) of the previous stage STi−1, and is charged. When the capacitor C2 is charged, the transistor T15 is turned on, so that the clock signal CK is output as the carry signal Cout(i) through the carry output terminal OUT2.

The pull-down unit 440 includes a transistor T2 having its drain connected to the source of transistor T1 and the second terminal of the capacitor C1, its source connected to the power supply terminal GV, and its gate connected to the reset terminal R. The pull-down unit 440 is turned on by a gate signal Gout(i+1) of a next stage STi+1 applied through the reset terminal R, and pulls down the gate signal Gout(i) to a gate-off voltage Voff.

The discharging unit 450 includes a transistor T9 having its gate connected to the reset terminal R, its drain connected to the first terminal of the capacitor C1, and its source connected to the power supply terminal GV to discharge the charging unit 420 in response to the gate signal Gout(i+1) of the next stage STi+1. The discharging unit 450 further includes a transistor T6 having its gate connected to the frame reset terminal FR, its drain connected to the first terminal of the capacitor C1, and its source connected to the power supply terminal GV to discharge the charging unit 420 in response to the initialization signal INT. Thus, the discharging unit 450 discharges the capacitor C1 to the gate-off voltage Voff in response to the gate signal Gout(i+1) of the next stage STi+1 or in response to the initialization signal INT to turn off the pull-up unit 430.

The holding unit 460 maintains a high-level state when the gate signal Gout(i) makes a low-to-high transition. After the gate signal Gout(i) makes a high-to-low transition, the holding unit 460 maintains the gate signal Gout(i) at a low level during one frame, irrespective of voltage levels of the clock signal CKV and the clock bar signal CKVB.

First, in a case where the gate signal Gout(i) makes a low-to-high transition, transistors T8 and T13 are turned on. The transistor T13 being on turns off transistor T7 to prevent the clock signal CKV of a high level from being supplied to transistor T3, while transistor T8 being on turns off transistor T3. Therefore, the gate signal Gout(i) is maintained at the high-level.

Next, after the gate signal Gout(i) makes a high-to-low transition, the transistors T8 and T13 are turned off. If the clock signal CKV is at a high level, transistors T7 and T12, being on, turn on transistor T3 to maintain the gate signal Gout(i) at a low level. In addition, transistor T10 is turned on to make the gate of transistor T1 maintain a low-level state, so that the high-level clock signal CKV is not output to the gate output terminal OUT1. Therefore, the clock bar signal CKVB is at a high level and transistors T5 and T11 are turned on. The turned-on transistor T5 maintains the gate signal Gout(i) at a low level, while the turned-on transistor T11 maintains the first terminal of the capacitor C1 at a low level. Therefore, the gate signal Gout(i) is maintained at a low level during the time period of one frame.

Alternatively, the stage STi may not include the carry-signal generator 470. In such a case, the stage STi may receive the gate signal Gout(i−1), instead of the carry signal Cout(i−1), of the previous stage STi−1 through the set terminal S for operation.

Figure 5:
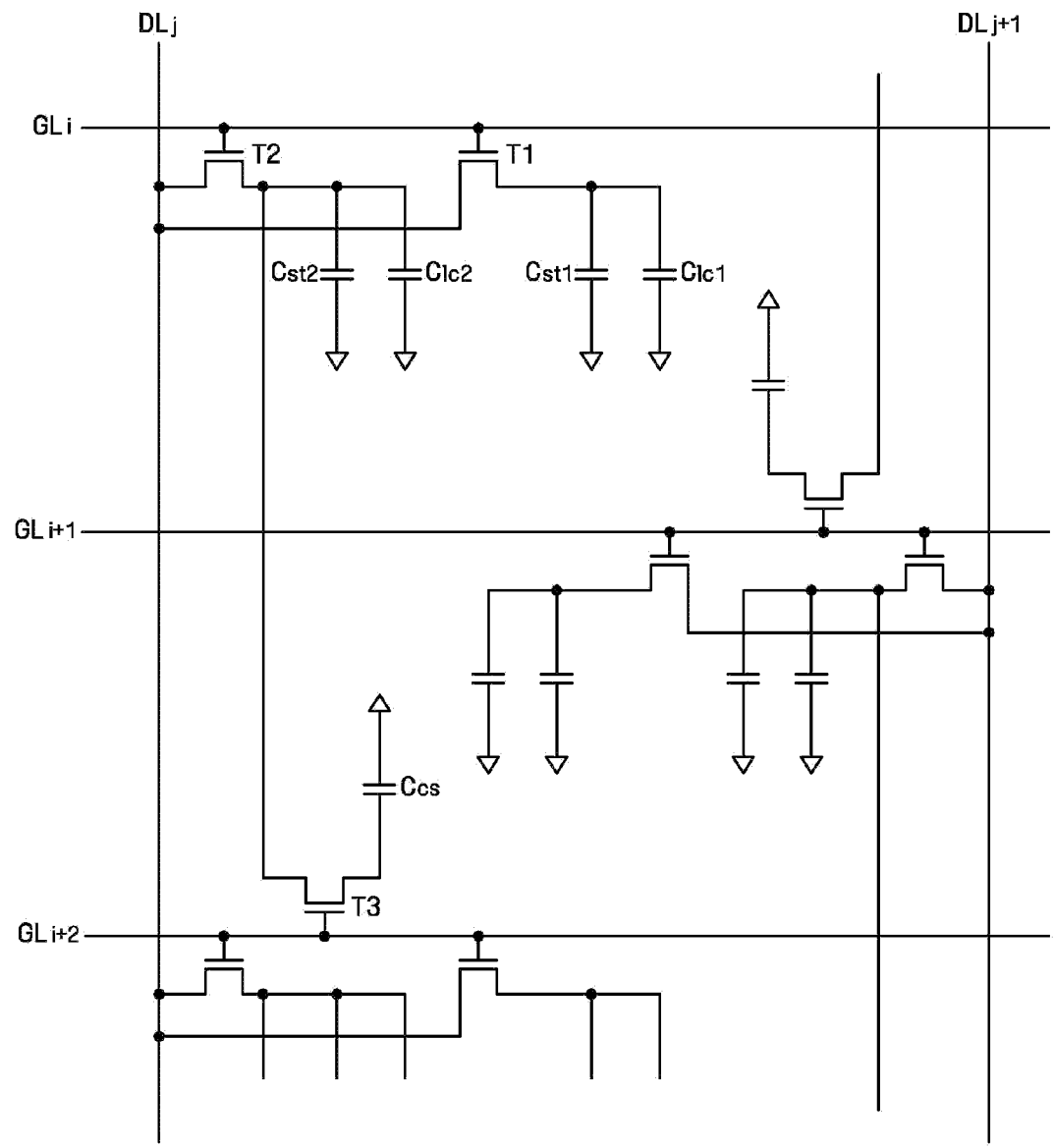
FIG. 5 is an equivalent circuit diagram of the LCD of FIG. 1.

Referring to FIG. 5, an LCD according to an exemplary embodiment of the present invention includes a plurality of gate lines GLi, GLi+1, and GLi+2 that transmit gate signals, and a plurality of data lines DLj and DLj+1 that cross the gate lines GLi, GLi+1, and GLi+2 and transmit data signals.

A first thin film transistor (TFT) T1 and a second TFT T2 are disposed where the $i^{th}$ gate line GLi and the $j^{th}$ data line DLj cross, and a third TFT T3 is connected to the $(i+2)^{th}$ gate line GLi+2.

The first TFT T1 includes a gate electrode connected to the $i^{th}$ gate line GLi, a source electrode connected to the $j^{th}$ data line DLj, and a drain electrode connected to a first liquid crystal (LC) capacitor Clc1 and to a first storage capacitor Cst1. The second TFT T2 includes a gate electrode connected to the $i^{th}$ gate line GLi, a source electrode connected to the $j^{th}$ data line DLj, and a drain electrode connected to a second LC capacitor Clc2 and to a second storage capacitor Cst2. The third TFT T3 includes a gate electrode connected to the $(i+2)^{th}$ gate line GLi+2, a source electrode connected to the drain electrode of the second TFT T2, and a drain electrode connected to a charge-sharing capacitor Ccs.

Each pixel of the lower display panel has a pixel electrode including a first sub-pixel electrode connected to the drain electrode of the first TFT T1 and a second sub-pixel electrode connected to the drain electrode of the second TFT T2. A common electrode is disposed on the upper display panel that faces the lower display panel.

The first LC capacitor Clc1 includes the first sub-pixel electrode connected to the first TFT T1, the common electrode, and the liquid crystal layer interposed between the first sub-pixel electrode and the common electrode. The first storage capacitor Cst1 includes the first sub-pixel electrode, a storage line disposed on the lower display panel, and a dielectric material interposed between the first sub-pixel electrode and the storage line.

The second LC capacitor Clc2 includes the second sub-pixel electrode connected to the second TFT T2, the common electrode, and the liquid crystal layer interposed between the second sub-pixel electrode and the common electrode. The second storage capacitor Cst2 includes the second sub-pixel electrode, a storage line disposed on the lower display panel, and a dielectric material interposed between the second sub-pixel electrode and the storage line.

The charge-sharing capacitor Ccs includes the drain electrode of the third TFT T3, the storage line disposed on the lower display panel, and a dielectric material interposed between the drain electrode and the storage line. Here, the charge-sharing capacitor Ccs drops the data voltage of the second sub-pixel electrode connected to the second TFT T2. In exemplary embodiments, an additional charge-sharing capacitor may be formed by overlapping the drain electrode of the third TFT T3 with the first sub-pixel electrode connected to the first TFT T1. The additional charge-sharing capacitor increases the data voltage of the first sub-pixel electrode connected to the first TFT T1.

Figure 6:
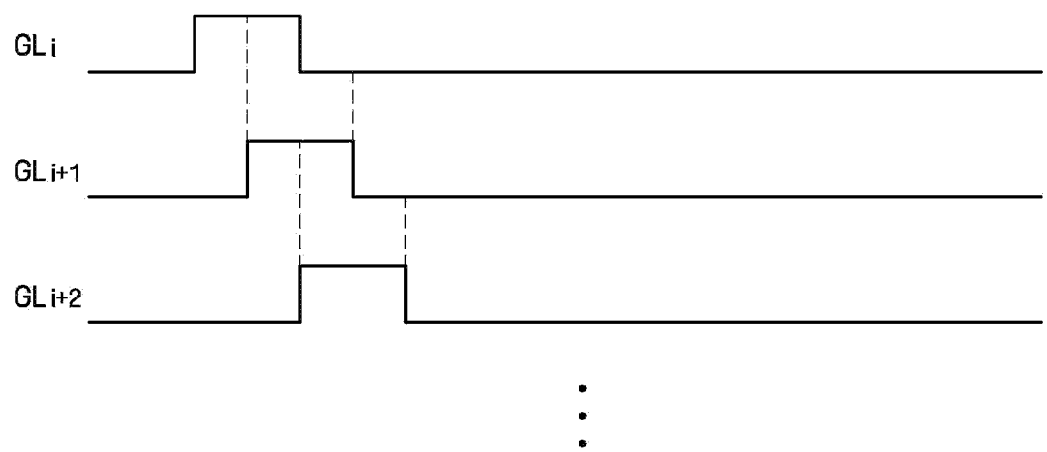
FIG. 6 is a timing diagram showing the operation of the gate driver shown in FIG. 1.

Referring to FIG. 5 and FIG. 6, when the gate-on voltage is applied to the $i^{th}$ gate line GLi, the same data voltages are applied from the $j^{th}$ data line DLj to the first and second sub-pixel electrodes disposed in the $i^{th}$ row, via the first and second TFTs T1 and T2, respectively. That is, the first and second LC capacitor Clc1 and Clc2 connected to the $i^{th}$ row are charged with the same data voltages. Subsequently, when the gate-off voltage is applied to the $i^{th}$ gate line GLi, the first sub-pixel electrode is not connected to the second sub-pixel electrode. That is, after the same data voltages are applied to the first and second sub-pixel electrodes, the first and second sub-pixel electrodes are in a floating state.

When the gate-on voltage is applied to the $(i+1)^{th}$ gate line GLi+1, same data voltages are applied to a pair of the sub-pixel electrodes disposed in the $(i+1)^{th}$ row, via a pair of switching devices connected to the $(i+1)^{th}$ gate line GLi+1, respectively. The $(i+1)^{th}$ gate-on voltage may be applied before the $i^{th}$ gate-off voltage. In this case, while the data voltages are applied to a pair of the sub-pixel electrodes disposed in the $i^{th}$ row, a pair of the sub-pixel electrodes disposed in the $(i+1)^{th}$ row may be pre-charged with the data voltages. Here, a pre-charging process is a driving method of applying gate-on voltages to a plurality of the gate lines GLi, GLi+1, and GLi+2 sequentially and overlappedly. Here, "overlappedly" means that the gate-on voltages are applied in an overlapped fashion such that a gate-on voltage is applied to the next gate line after the initial application of the gate-on voltage to the previous gate, but prior to termination of the application of the gate-on voltage to the previous gate line. In an exemplary embodiment, the pixel has a substantially rectangular shape having a transverse length longer than a longitudinal length, and thus the LCD may be driven at a sufficient speed even if the number of the gate lines increases. However, the present invention is not limited thereto and the $(i+1)^{th}$ gate-on voltage may be applied after the $i^{th}$ gate-off voltage. Subsequently, when the gate-off voltage is applied to the $(i+1)^{th}$ gate line GLi+1, a pair of the sub-pixel electrodes connected to the $(i+1)^{th}$ gate line GLi+1 are not connected to each other, thereby being in a floating state.

When the gate-on voltage is applied to the $(i+2)^{th}$ gate line GLi+2, same data voltages are applied to a pair of the sub-pixel electrodes disposed in the $(i+2)^{th}$ row, via a pair of switching devices connected to the $(i+2)^{th}$ gate line GLi+2, respectively. The $(i+2)^{th}$ gate-on voltage may be applied before the $(i+1)^{th}$ gate-off voltage.

In addition, when the gate-on voltage is applied to the $(i+2)^{th}$ gate line GLi+2, the data voltage of the second sub-pixel electrode connected to the second TFT T2 is shared with the charge-sharing capacitor Ccs via the third TFT T3. This is because the source electrode of the third TFT T3 is connected to the second sub-pixel electrode connected to the second TFT T2 and the drain electrode of the third TFT T3 is connected to the charge-sharing capacitor Ccs. Consequently, the first and second sub-pixel electrodes, which are disposed in the $i^{th}$ row and respectively connected to the first and second TFTs T1 and T2, have different data voltages. In detail, the data voltage of the second sub-pixel electrode drops since the data voltage of the second sub-pixel electrode connected to the second TFT T2 is shared with the charge-sharing capacitor Ccs via the third TFT T3.

Lateral visibility may be improved when the first and second sub-pixel electrodes disposed in a pixel have different data voltages. A pair of gray-scale voltage sets, which have different gamma curves obtained from a piece of image information, are applied to the first and second sub-pixel electrodes. Thus, a gamma curve for a pixel electrode including the first and second sub-pixels can be obtained by synthesizing the gamma curves for the first and second sub-pixel electrodes. It may be possible to improve lateral visibility by determining gray-scale voltages for the respective sub-pixels so that a synthetic gamma curve obtained from the front of an LCD is similar to a reference gamma curve for the front of the LCD and a synthetic gamma curve obtained from either side of the LCD is as similar as possible to the reference gamma curve.

Subsequently, when the gate-off voltage is applied to the $(i+2)^{th}$ gate line GLi+2, a pair of the sub-pixel electrodes connected to the $(i+2)^{th}$ gate line GLi+2 are not connected to each other, thereby being in a floating state. In addition, the second sub-pixel electrode connected to the second TFT T2 disposed in the $i^{th}$ row is not connected to the charge-sharing capacitor Ccs, thereby being in a floating state.

The structure of an LCD according to an exemplary embodiment of the present invention will hereinafter be described in detail with reference to FIG. 7, FIG. 8, FIG. 9, FIG. 10, and FIG. 11. An LCD according to an exemplary embodiment of the present invention includes a lower display panel on which a TFT array is disposed, an upper display panel that faces the lower display panel, and a liquid crystal layer that is interposed between the lower display panel and the upper display panel.

Figure 7:
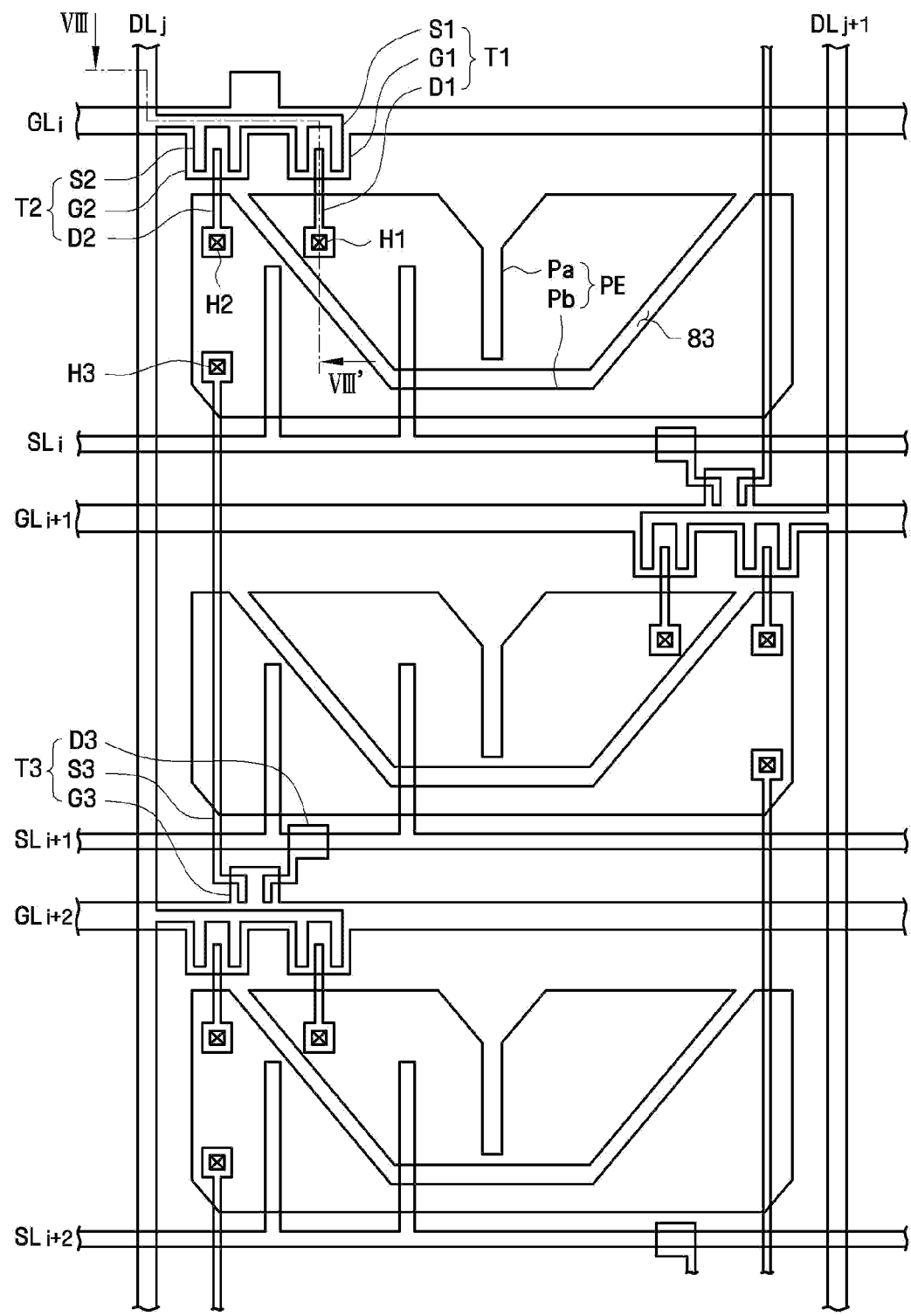
FIG. 7 is a layout of a lower display panel of an LCD according to an exemplary embodiment of the present invention.

The structure of a lower display panel of an LCD according to an exemplary embodiment of the present invention will hereinafter be described in detail with reference to FIG. 7 and FIG. 8. FIG. 7 is a layout of a lower display panel of an LCD according to an exemplary embodiment of the present invention, and FIG. 8 is a cross-sectional schematic diagram view taken along line VIII-VIII' of the lower display panel of FIG. 7.

Figure 8:
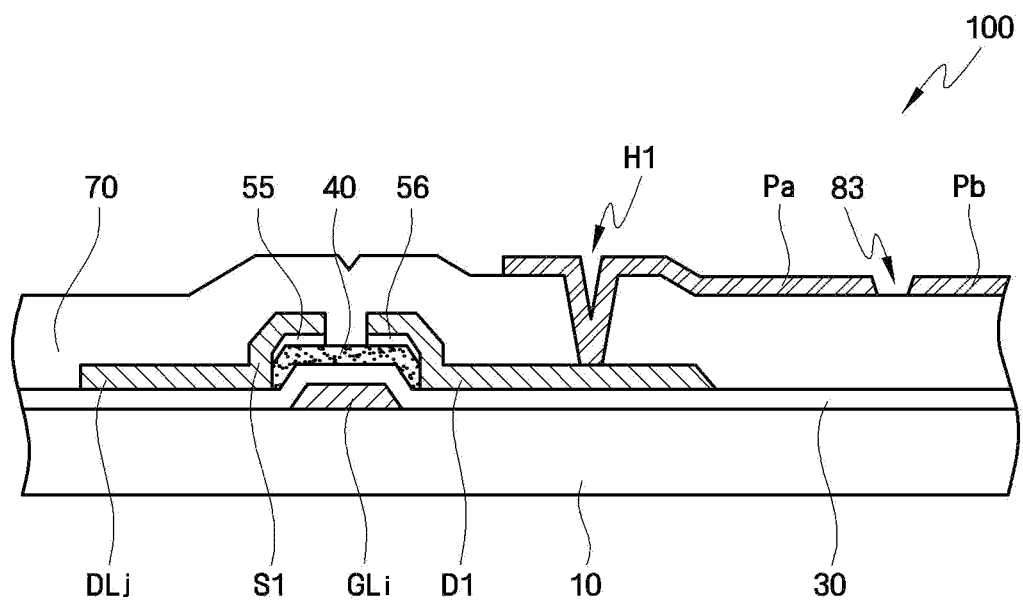
FIG. 8 is a cross-sectional schematic diagram view taken along line VIII-VIII' of the lower display panel of FIG. 7.

Referring to FIG. 7 and FIG. 8, gate lines GLi, GLi+1, and GLi+2 are disposed on an insulation substrate 10 that may include, for example, transparent glass. The gate lines GLi, GLi+1, and GLi+2 extend in a horizontal direction and transmit gate signals. First and second gate electrodes G1 and G2 in the form of a protrusion are coupled to an $i^{th}$ gate line GLi. A third gate electrode G3 in the form of a protrusion is coupled to an $(i+2)^{th}$ gate line GLi+2. The gate lines GLi, GLi+1, and GLi+2 and the first, second, and third gate electrodes G1, G2, and G3 are collectively referred to as gate interconnections.

Storage lines SLi, SLi+1, and SLi+2 are disposed on the insulation substrate 10 and extend across a pixel region along a horizontal direction. The storage lines SLi, SLi+1, and SLi+2 include protrusions that may overlap the first and second sub-pixel electrode Pa and Pb. The shape and arrangement of the storage lines SLi, SLi+1, and SLi+2 may be altered in various manners. The common voltage Vcom may be applied to the storage lines SLi, SLi+1, and SLi+2.

In exemplary embodiments, the gate interconnections GLi, GLi+1, GLi+2, G1, G2, and G3 and the storage lines SLi, SLi+1, and SLi+2 may include aluminum (Al) or an aluminum-based metallic material such as an aluminum alloy, silver (Ag) or a silver-based metallic material such as a silver alloy, copper (Cu) or a copper-based metallic material such as a copper alloy, molybdenum (Mo) or a molybdenum-based metallic material such as a molybdenum alloy, chrome (Cr), titanium (Ti), or tantalum (Ta). In exemplary embodiments, the gate interconnections GLi, GLi+1, GLi+2, G1, G2, and G3 and the storage lines SLi, SLi+1, and SLi+2 may include a multi-layered structure including two conductive layers (not shown) having different physical properties. In an exemplary embodiment, one of the two conductive layers may include a low-resistance metal, for example, aluminum or an aluminum-based metallic material, silver or a silver-based metallic material, or copper or a copper-based metallic material such that the possibility of a signal delay or a voltage drop can be reduced. In further exemplary embodiments, the other conductive layer may include a material including excellent contact characteristics to, for example, indium tin oxide ("ITO") or indium zinc oxide ("IZO"), such as molybdenum or a molybdenum-based metallic material, chromium, titanium, or tantalum. In further exemplary embodiments, the gate interconnections GLi, GLi+1, GLi+2, G1, G2, and G3 and the storage lines SLi, SLi+1, and SLi+2 may be double layers including a chromium layer (as a lower layer) and an aluminum layer (as an upper layer) or including an aluminum layer (as a lower layer) and a molybdenum layer (as an upper layer). However, the present invention is not restricted to this. That is, in exemplary embodiments, the gate interconnections GLi, GLi+1, GLi+2, G1, G2, and G3 and the storage lines SLi, SLi+1, and SLi+2 may include various metals and conductive materials other than those set forth herein.

A gate insulation layer 30 may include silicon nitride ("SiNx") on the gate interconnections GLi, GLi+1, GLi+2, G1, G2, and G3 and on the storage lines SLi, SLi+1, and SLi+2.

In exemplary embodiments, semiconductor layers 40 may include hydrogenated amorphous silicon or polycrystalline silicon on the gate insulation layer 30. In an exemplary embodiment, the semiconductor layers 40 may have various shapes, such as island shapes or line shapes. In an exemplary embodiment, for example, the semiconductor layers 40 may have an island shape. When the semiconductor layers 40 have a line shape, they may be disposed under the data line DLj.

A pair of ohmic contact layers 55 and 56 may include silicide or n+ hydrogenated amorphous silicon doped with a high concentration of n-type impurities on the semiconductor layers 40. In an exemplary embodiment, the ohmic contact layers 55 and 56 may have various shapes, such as island shapes or line shapes. When the ohmic contact layers 55 and 56 may have an island shape, they may be disposed under the first drain electrode D1 and the first source electrode S1. When the ohmic contact layers 55 and 56 have a line shape, they may be disposed under the data line DLj and DLj+1.

The data lines DLj and DLj+1 and the first, second, and third drain electrode D1, D2, and D3 are disposed on the ohmic contact layer 55 and 56 and the gate insulation layer 30.

The data lines DLj and DLj+1 extend along a longitudinal direction and cross the gate lines GLi, GLi+1, and GLi+2 to define a pixel. The first and second source electrodes S1 and S2 branch off from the first data line DLj and extend toward the first and second drain electrodes D1 and D2, respectively. The first drain electrode D1, which is positioned on the semiconductor layer 40, is spaced apart from and opposite to the first source electrodes S1 with respect to the first gate electrodes G1. The second drain electrode D2, which is positioned on the semiconductor layer 40, is spaced apart from and opposite to the second source electrodes S2 in view of the second gate electrodes G2. The first and second drain electrode D1 and D2 include a stripe pattern and an extension pattern extending from the stripe pattern. The stripe pattern is on the semiconductor layer 40. The extension pattern has a large area and first and second contact holes H1 and H2. Here, the first and second contact holes overlap the first and second sub-pixel electrodes Pa and Pb, respectively.

The third source electrode S3 extends from the third contact hole H3 overlapped by the second sub-pixel electrode Pb onto an upper portion of the third gate electrode G3. The third drain electrode D3 extends from an upper portion of the third gate electrode G3 to an upper portion of the $(i+1)^{th}$ storage line SLi+1. The third drain electrode D3, which is positioned on the semiconductor layer 40, is spaced apart from and opposite to the third source electrodes S3 with respect to the third gate electrodes G3.

The data lines DLj and DLj+1, the first, second, and third source electrode S1, S2, and S3, and the first, second, and third drain electrode D1, D2, and D3 are collectively referred to as data interconnections.

In exemplary embodiments, the data interconnections DLj, DLj+1, S1, S2, S3, D1, D2, and D3 may include refractory metal such as chromium, molybdenum or a molybdenum-based metallic material, tantalum, or titanium. In further exemplary embodiments, the data interconnections DLj, DLj+1, S1, S2, S3, D1, D2, and D3 may have a multi-layered structure including a lower layer (not shown) that includes a refractory metal and an upper layer (not shown) that includes a low-resistance material. Examples of the multi-layered structure include a double-layered structure having an upper Cr film and an upper Al film or a lower Al film and an upper Mo film, and a triple-layered structure having a lower Mo film, an intermediate Al film, and an upper Mo film.

The first source electrode Si at least partially overlaps the semiconductor layer 40. The first drain electrode D1 is opposite to and faces the first source electrode S1 with respect to the first gate electrode G1, and at least partially overlaps the semiconductor layer 40. Here, the ohmic contacts 55 and 56 are interposed between the underlying semiconductor layer 40 and the overlying first source electrode S1 and between the underlying semiconductor layer 40 and the overlying first drain electrode D1, to reduce the contact resistance between them.

The second source electrode S2 at least partially overlaps the semiconductor layer 40. The second drain electrode D2 is opposite to and faces the second source electrode S2 with respect to the second gate electrode G2, and at least partially overlaps the semiconductor layer. Here, the ohmic contacts are interposed between the underlying semiconductor layer and the overlying second source electrode S2 and between the underlying semiconductor layer and the overlying second drain electrode D2, to reduce the contact resistance between them.

A passivation layer 70 is disposed on the data interconnections DLj, DLj+1, S1, S2, S3, D1, D2, and D3 and on portions of the semiconductor layers exposed between the source electrodes and the drain electrodes. In exemplary embodiments, the passivation layer 70 may include a silicon nitride- or silicon-oxide-based inorganic material, a photosensitive organic material with excellent planarization properties, or a low-k dielectric material such as a-Si:C:O or a-Si:O:F that may be formed using a plasma enhanced chemical vapor deposition ("PECVD") method. In exemplary embodiments, the passivation layer 70 may include a double-layer structure consisting of a lower inorganic layer and an upper organic layer so as to provide excellent properties of organic layers and to effectively protect the exposed portions of the semiconductor layer 40.

The passivation layer 70 has first, second, and third contact holes H1, H2, and H3 exposing the first, second, and third drain electrode D1, D2, and D3, respectively.

The pixel electrode PE is disposed on the passivation layer 70 according to pixel shape. The pixel electrode PE may have a substantially rectangular shape having a transverse length longer than a longitudinal length. The pixel electrode includes the first and second sub-pixel electrode Pa and Pb. The first sub-pixel electrode Pa is connected to the first drain electrode D1 via the first contact hole H1, and the second sub-pixel electrode Pb is connected to the second and third drain electrodes D2 and D3 via the second and third contact holes H2 and H3, respectively. In exemplary embodiments, the first and second sub-pixel electrodes Pa and Pb may include a transparent conductive material, such as ITO or IZO, or may include a reflective conductive material, such as aluminum.

The first and second sub-pixel electrodes Pa and Pb are respectively connected to the first and second drain electrodes D1 and D2 via the first and second contact holes H1 and H2, and thus are each provided with data voltages by the first and second drain electrodes D1 and D2, respectively. In an exemplary embodiment, the first and second source electrodes S1 and S2, which respectively transmit data voltages to the first and second drain electrodes D1 and D2, are connected to each other, and thus data voltages applied to the first and second sub-pixel electrodes Pa and Pb from the $j^{th}$ data line DLj are substantially the same.

An electric field is generated between the first and second sub-pixel electrodes Pa and Pb supplied with the data voltages and the common electrode of the upper display panel, which determines an orientation of liquid crystal molecules in the LC layer between the first and second sub-pixel electrodes Pa and Pb and the common electrode.

The first and second sub-pixel electrodes Pa and Pb, which constitute a pixel region, are spaced apart from each other by gaps 83 and form a substantially rectangular shape having a transverse length longer than a longitudinal length. The first sub-pixel electrode Pa is V-shaped and is located in the middle of the pixel region. The second sub-pixel electrode Pb is arranged in different portions of the pixel region than the first sub-pixel electrode Pa. Here, the gaps 83 include a gap that forms an angle of about 45 degrees with a transmission axis of a polarizing plate (or with the gate lines GLi, GLi+1, and GLi+2), and a gap that forms an angle of about −45 degrees with the transmission axis of the polarizing plate (or the gate lines GLi, GLi+1, and GLi+2). Therefore, the edges of the first and second sub-pixel electrodes Pa an d Pb adjacent to the gaps 83 form an angle of 45 degrees or −45 degrees with the gate lines GLi, GLi+1, and GLi+2 (hereinafter referred to as oblique directions). A plurality of first domain dividers (not shown) may be disposed in the first and second sub-pixel electrodes Pa and Pb in oblique directions. In exemplary embodiments, the plurality of first domain dividers may be cutouts or protrusions. A display region of the pixel electrode PE may be divided into a plurality of domains according to the orientation of the LC molecules in an LC layer when an electric field is applied to the LC layer. The gaps 83 and the plurality of first domain divider divide the pixel electrode PE into a number of domains. Here, a domain is an area defined by a group of LC molecules that are uniformly tilted in the same direction due to an electric field formed between the pixel electrode PE and a common electrode 90 of FIG. 4.

As described above, when the gate-on voltage is applied to the $i^{th}$ gate line GLi, the same data voltages are applied from the $j^{th}$ data line DLj to the first and second sub-pixel electrodes Pa and Pb adjacent to the $i^{th}$ gate line GLi. Subsequently, when the gate-on voltage is applied to the $(i+2)^{th}$ gate line GLi+2, the data voltage of the second sub-pixel electrode Pb is shared with the third drain electrode D3 via the third TFT T3. The charge-sharing capacitor is disposed between the third drain electrode D3 and the $(i+1)^{th}$ storage line SLi+1 disposed under the third drain electrode D3. Therefore, the data voltage of the second sub-pixel electrode Pb drops and the data voltage of the first sub-pixel electrode Pa increases.

In an exemplary embodiment, an alignment layer (not shown) to align the LC molecules of the LC layer may be disposed on the first and second sub-pixel electrodes Pa and Pb and on the passivation layer 70.

The structures of an upper display panel and an LCD device according to an exemplary embodiment of the present invention will hereinafter be described in detail with reference to FIG. 9, FIG. 10, and FIG. 11.

Figure 10:
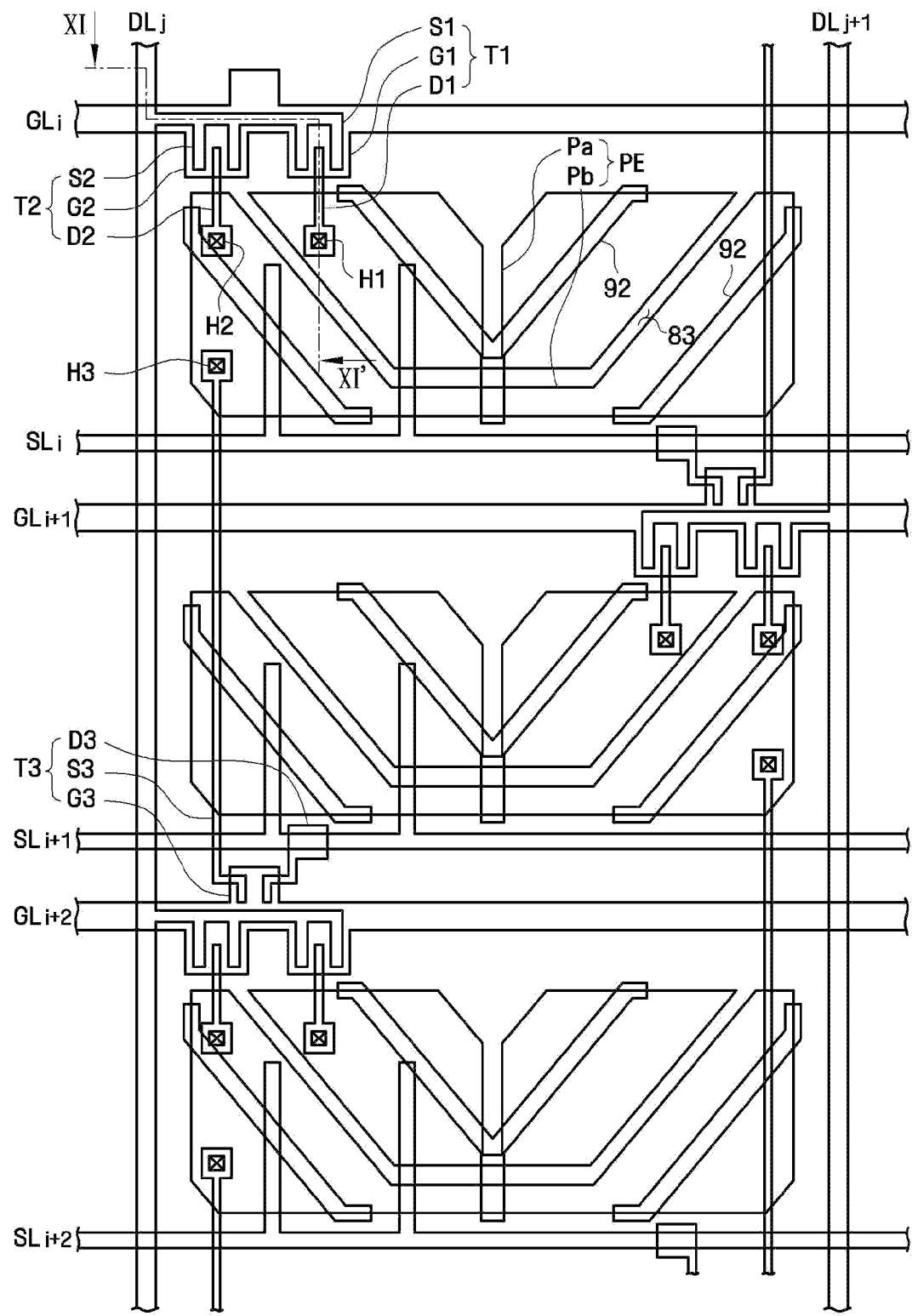
FIG. 10 is a layout of an LCD including the lower display panel of FIG. 7 and the upper display panel of FIG. 9 according to an exemplary embodiment of the present invention.
Figure 11:
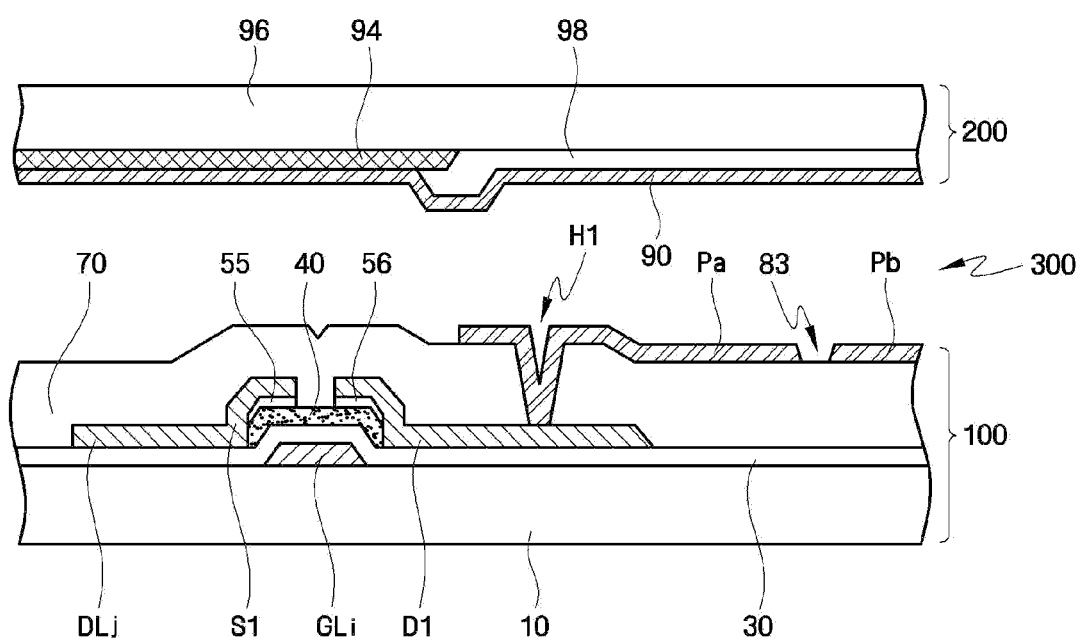
FIG. 11 is a cross-sectional schematic diagram view taken along line XI-XI' of the LCD of FIG. 10.

Referring to FIG. 9, FIG. 10, and FIG. 11, a black matrix 94, color filters 98, e.g., red, green, and blue filters, and a common electrode 90 are disposed on an insulation substrate 96 that may include a transparent material, such as glass. The common electrode 90 may include a transparent and conductive material, such as ITO or IZO. The black matrix corresponds to the gate lines GLi, GLi+1, and GLi+2, the data lines DLj and DLj+1, and the switching devices T1, T2, and T3. The black matrix may have any of various shapes as long as it can prevent light leakage from occurring in the neighborhood of the first and second sub-pixel electrodes Pa and Pb and the switching devices T1, T2, and T3.

The common electrode 90 faces the first and second sub-pixel electrodes Pa and

Pb and includes a plurality of second domain dividers 92. The plurality of second domain dividers may be cutouts or protrusions. Here, the domain dividers 92 include oblique portions that form an angle of −45 degrees or 45 degrees with the transmission axis of the polarizing plate (or with the gate lines GLi, GLi+1, and GLi+2). In an exemplary embodiment, the description will be made of a case where the second domain dividers are made of cutouts, for brevity.

The oblique portions of the second domain divider 92 disposed in the common electrode 90 alternate with the oblique portions of the gaps 83 between the first and second sub-pixel electrodes Pa and Pb.

In an exemplary embodiment, an alignment layer (not shown) to align liquid crystal molecules of the liquid crystal layer 150 may be disposed on the common electrode 90.

A basic LCD structure according to an exemplary embodiment of the present invention can be formed by vertically aligning the lower display panel 100 and the upper display panel 200 with each other and coupling them with a liquid crystal material interposed therebetween. In addition to the above-described basic LCD structure, the LCD may also include additional elements, such as polarizing plates and a backlight assembly. In an exemplary embodiment, the polarizing plates may be arranged on opposite sides of the basic LCD structure such that a transmission axis of one of the polarizing plates is parallel to the gate lines GLi, GLi+1, and GLi+2 and a transmission axis of the other polarizing plate is perpendicular to the gate lines GLi, GLi+1, and GLi+2.

When an electric field is applied between the lower display panel and the upper display panel, the LC molecules in each domain tilt in a direction perpendicular to the gaps 83 or the second domain dividers 92. Therefore, the LC molecules in each domain tilt by forming an angle of about 45 degrees or −45 degrees with respect to the transmission axis of the polarizing plate or the gate lines GLi, GLi+1, and GLi+2. A lateral electric field formed in each of the gaps 83 or the second domain dividers 92 facilitates the alignment of liquid crystal molecules in each domain.

The above-described exemplary embodiments show the third TFT T3 connected to the $(1+2)^{th}$ gate line GLi+2 but the third TFT T3 may alternatively be connected to the $(i+1)^{th}$ gate line GLi+1 when a pre-charging process is not applied to the $i^{th}$ gate line GLi and the $(i+1)^{th}$ gate line GLi+1.

Hereinafter, an LCD according to another exemplary embodiment of the present invention will be described with reference to FIG. 12, FIG. 13, FIG. 14, FIG. 15, FIG. 16, FIG. 17, FIG. 18, FIG. 19, and FIG. 20. Components having the same or similar function as described in connection with FIG. 1, FIG. 2, FIG. 3, FIG. 4, FIG. 5, FIG. 6, FIG. 7, FIG. 8, FIG. 9, FIG. 10, and FIG. 11 of the previous exemplary embodiment are identified by the same reference numerals, and their descriptions will not be repeated.

Figure 12:
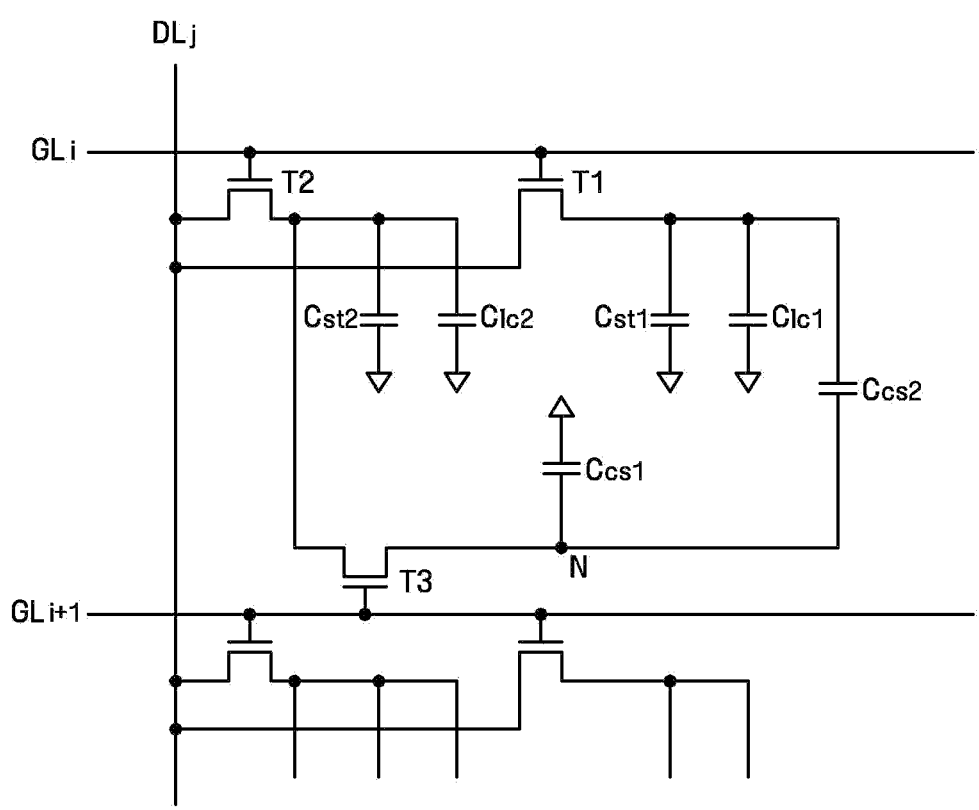
FIG. 12 is an equivalent circuit diagram of the LCD according to another exemplary embodiment of the present invention.

FIG. 12 is an equivalent circuit diagram of the LCD according to another exemplary embodiment of the present invention.

Referring to FIG. 12, an LCD includes a plurality of gate lines GLi and GLi+1 that transmit gate signals and a plurality of data lines DLj that cross the gate lines and transmit data signals.

A first thin film transistor (TFT) T1 and a second TFT T2 are arranged where the $i^{th}$ gate line GLi and the $j^{th}$ data line DLj cross, and a third TFT T3 is connected to the $(i+1)^{th}$ gate line GLi+1.

The first TFT T1 includes a gate electrode connected to the $i^{th}$ gate line GLi, a source electrode connected to the $j^{th}$ data line DLj, and a drain electrode connected to a first LC capacitor Clc1 and to a first storage capacitor Cst1. The second TFT T2 includes a gate electrode connected to the $i^{th}$ gate line GLi, a source electrode connected to the $j^{th}$ data line DLj, and a drain electrode connected to a second LC capacitor Clc2 and to a second storage capacitor Cst2. The third TFT T3 includes a gate electrode connected to the $(i+1)^{th}$ gate line GLi+1, a source electrode connected to the drain electrode of the second TFT T2, and a drain electrode connected to a first charge-sharing capacitor Ccs1 to and a second charge-sharing capacitor Ccs2.

Each pixel of the lower display panel has a pixel electrode including a first sub-pixel electrode connected to the drain electrode of the first TFT T1 and a second sub-pixel electrode connected to the drain electrode of the second TFT T2. A common electrode is disposed on the upper display panel that faces the lower display panel.

The first LC capacitor Clc1 includes the first sub-pixel electrode connected to the first TFT T1, the common electrode, and the LC layer interposed between the first sub-pixel electrode and the common electrode. The first storage capacitor Cst1 includes the first sub-pixel electrode, a storage line disposed on the lower display panel, and a dielectric material interposed between the first sub-pixel electrode and the storage line.

The second LC capacitor Clc2 includes the second sub-pixel electrode connected to the second TFT T2, the common electrode, and the LC layer interposed between the second sub-pixel electrode and the common electrode. The second storage capacitor Cst2 includes the second sub-pixel electrode, a storage line disposed on the lower display panel, and a dielectric material interposed between the second sub-pixel electrode and the storage line.

The first charge-sharing capacitor Ccs1 includes the drain electrode of the third TFT T3, the storage line disposed on the lower display panel, and a dielectric material interposed between the drain electrode and the storage line.

The second charge-sharing capacitor Ccs2 includes the drain electrode of the third TFT T3, the first sub-pixel electrode, and a dielectric material interposed between the drain electrode and the first sub-pixel electrode.

When the gate-on voltage is applied to the $i^{th}$ gate line GLi, the same data voltages are applied from the $j^{th}$ data line DLj to the first and second sub-pixel electrodes disposed in the $i^{th}$ row, via the first and second TFTs T1 and T2, respectively. That is, the first and second LC capacitors Clc1 and Clc2 connected to the $i^{th}$ row are charged with the same data voltages. Subsequently, when the gate-off voltage is applied to the $i^{th}$ gate line GLi, the first sub-pixel electrode is not connected to the second sub-pixel electrode. That is, after the same data voltages are applied to the first and second sub-pixel electrodes, the first and second sub-pixel electrodes are in a floating state.

When the gate-on voltage is applied to the $(i+1)^{th}$ gate line GLi+1, the same data voltages are applied to a pair of the sub-pixel electrodes disposed in the $(i+1)^{th}$ row, via a pair of switching devices connected to the $(i+1)^{th}$ gate line GLi+1, respectively. The $(i+1)^{th}$ gate-on voltage may be applied before the $i^{th}$ gate-off voltage. In this case, while the data voltages are applied to a pair of the sub-pixel electrodes disposed in the $i^{th}$ row, a pair of the sub-pixel electrodes disposed in the $(i+1)^{th}$ row may be pre-charged with the data voltages. Here, a pre-charging process is a driving method of applying gate-on voltages to a plurality of the gate lines GLi and GLi+1 sequentially and overlappedly. In an exemplary embodiment, the pixel has a substantially rectangular shape having a transverse length longer than a longitudinal length, and thus the LCD may be driven at a sufficient speed even if the number of the gate lines increases. However, the present invention is not limited thereto and the $(i+1)^{th}$ gate-on voltage may be applied after the $i^{th}$ gate-off voltage. The pre-charging process in an exemplary embodiment will be described in further detail below. Subsequently, when the gate-off voltage is applied to the $(i+1)^{th}$ gate line GLi+1, a pair of the sub-pixel electrodes connected to the $(i+1)^{th}$ gate line GLi+1 are not connected to each other, thereby being in a floating state.

Here, when the gate-on voltage is applied to the $(i+1)^{th}$ gate line GLi+1, the data voltage of the second sub-pixel electrode connected to the second TFT T2 is shared with the first and second charge-sharing capacitors Ccs1 and Ccs2 via the third TFT T3. This is because the source electrode of the third TFT T3 is connected to the second sub-pixel electrode connected to the second TFT T2 and the drain electrode of the third TFT T3 is connected to the first and second charge-sharing capacitors Ccs1 and Ccs2. Consequently, the first and second sub-pixel electrodes, which are disposed in the $i^{th}$ row and respectively connected to the first and second TFTs T1 and T2, have different data voltages.

In detail, when the gate-on voltage is applied to the $i^{th}$ gate line GLi, the data voltage is applied through the first and second TFTs T1 and T2. In a case where the data voltage has positive polarity level with respect to the common voltage Vcom, the common voltage Vcom is applied to a first terminal of the first charge-sharing capacitor Ccs1, and thus the voltage of a node N between the first and second charge-sharing capacitor Ccs1 and Ccs2 is lower than the data voltage. Subsequently, when the gate-off voltage is applied to the $i^{th}$ gate line GLi and the gate-on voltage is applied to the $(i+1)^{th}$ gate line GLi+1, a current flows from the second sub-pixel electrode to the first and second charge-sharing capacitors Ccs1 and Ccs2 via the third TFT T3 since the data voltage of the second sub-pixel electrode connected to the second TFT T2 is relatively higher than that of the node N. Therefore, the data voltage of the second sub-pixel electrode drops and the voltages of the node N and the first sub-pixel electrode increase. In a case where the data voltage has negative polarity level with respect to the common voltage Vcom, the data voltages of the first and second sub-pixel electrodes change vice versa. Consequently, the absolute value of a voltage between the first sub-pixel electrode and the common electrode is always higher than the absolute value of a voltage between the second sub-pixel electrode and the common electrode.

Lateral visibility may be improved when the first and second sub-pixel electrodes disposed in a pixel have different data voltages. A pair of gray-scale voltage sets, which have different gamma curves obtained from a piece of image information, are applied to the first and second sub-pixel electrodes. Thus, a gamma curve for a pixel electrode including the first and second sub-pixels may be obtained by synthesizing the gamma curves for the first and second sub-pixel electrodes. It may be possible to improve lateral visibility by determining gray-scale voltages for the respective sub-pixels so that a synthetic gamma curve obtained from the front of an LCD is similar to a reference gamma curve for the front of the LCD and a synthetic gamma curve obtained from either side of the LCD is as similar as possible to the reference gamma curve.

Subsequently, when the gate-off voltage is applied to the $(i+1)^{th}$ gate line GLi+1, a pair of the sub-pixel electrodes connected to the $(i+1)^{th}$ gate line GLi+1 are not connected to each other, thereby being in a floating state. In addition, the first and second sub-pixel electrodes connected to the $i^{th}$ gate line GLi are not connected to each other, thereby being in a floating state.

The structure of an LCD according to another exemplary embodiment of the present invention will hereinafter be described in detail with reference to FIG. 13. An LCD includes a lower display panel on which a TFT array is disposed, an upper display panel that faces the lower display panel, and a liquid crystal layer that is interposed between the lower display panel and the upper display panel.

Figure 13:
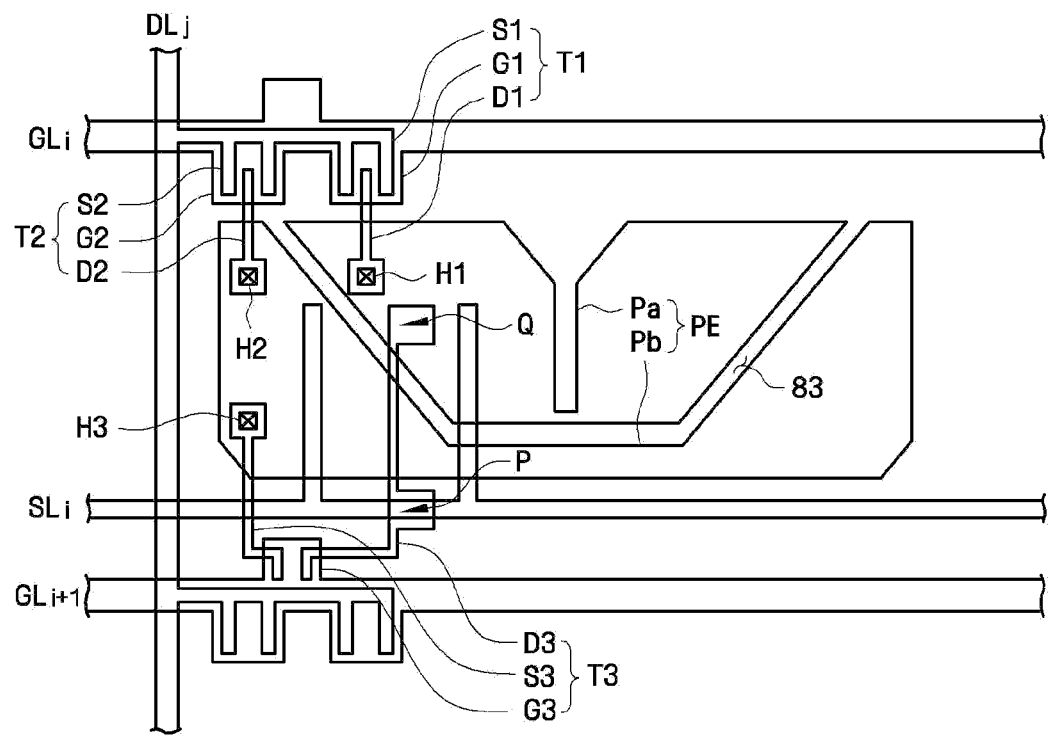
FIG. 13 is a layout of a lower display panel of an LCD according to another exemplary embodiment of the present invention.

FIG. 13 is a layout of a lower display panel of an LCD according to another exemplary embodiment of the present invention. Components having the same or similar function as described in connection with FIG. 1, FIG. 2, FIG. 3, FIG. 4, FIG. 5, FIG. 6, FIG. 7, FIG. 8, FIG. 9, FIG. 10, and FIG. 11 of the previous exemplary embodiments are identified by the same reference numerals, and their descriptions will not be repeated. In the following, an explanation will be given in conjunction with differences between the previous and current exemplary embodiments.

Referring to FIG. 13, gate lines GLi and GLi+1 are disposed on an insulation substrate. The gate lines GLi and GLi+1 extend in a horizontal direction and transmit gate signals. First and second gate electrodes G1 and G2 in the form of a protrusion are coupled to an $i^{th}$ gate line GLi. A third gate electrode G3 in the form of a protrusion is coupled to an $(i+1)^{th}$ gate line GLi+1. The gate lines GLi and GLi+1 and the first and second gate electrodes G1 and G2 are collectively referred to as gate interconnections.

The third source electrode S3 extends from the third contact hole H3 overlapped by the second sub-pixel electrode Pb onto an upper portion of the third gate electrode G3. The third drain electrode D3 extends from an upper portion of the third gate electrode G3 to a lower portion of the first sub-pixel electrode Pa via an upper portion of the $i^{th}$ storage line SLi. The third drain electrode D3, which is positioned on the semiconductor layer 40, is spaced apart from and opposite to the third source electrodes S3 with respect to the third gate electrodes G3. The first charge-sharing capacitor Ccs1 is formed at the area P where the third drain electrode D3 and the $i^{th}$ storage line SLi overlap. The second charge-sharing capacitor Ccs2 is formed at the area Q where the third drain electrode D3 and the first sub-pixel electrode Pa overlap.

When the gate-on voltage is applied to the $i^{th}$ gate line GLi, the same data voltages are applied from the $j^{th}$ data line DLj to the first and second sub-pixel electrodes Pa and Pb adjacent to the $i^{th}$ gate line GLi. Subsequently, when the gate-on voltage is applied to the $(i+1)^{th}$ gate line GLi+1, the data voltage of the second sub-pixel electrode Pb is shared with the third drain electrode D3 via the third TFT T3. Therefore, the data voltage of the second sub-pixel electrode Pb drops and the data voltage of the first sub-pixel electrode Pa increases.

Hereinafter, various driving methods of an LCD according to exemplary embodiments of the present invention will be described with reference to FIG. 14, FIG. 15, FIG. 16, FIG. 17, FIG. 18, FIG. 19, and FIG. 20.

First, a method of driving an LCD according to an exemplary embodiment of the present invention will be described with reference to FIG. 14, FIG. 15, FIG. 16, and FIG. 17.

Figure 14:
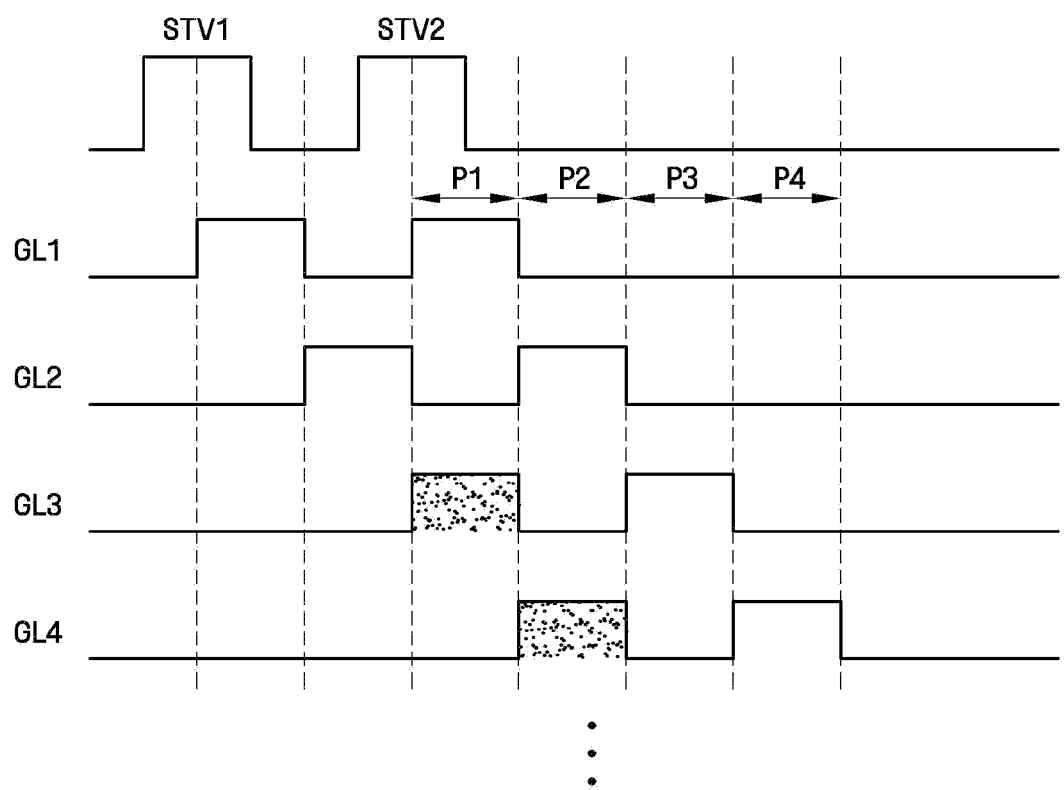
FIG. 14 is a timing diagram for representing the gate signal according to an exemplary embodiment of the present invention.
Figure 15:
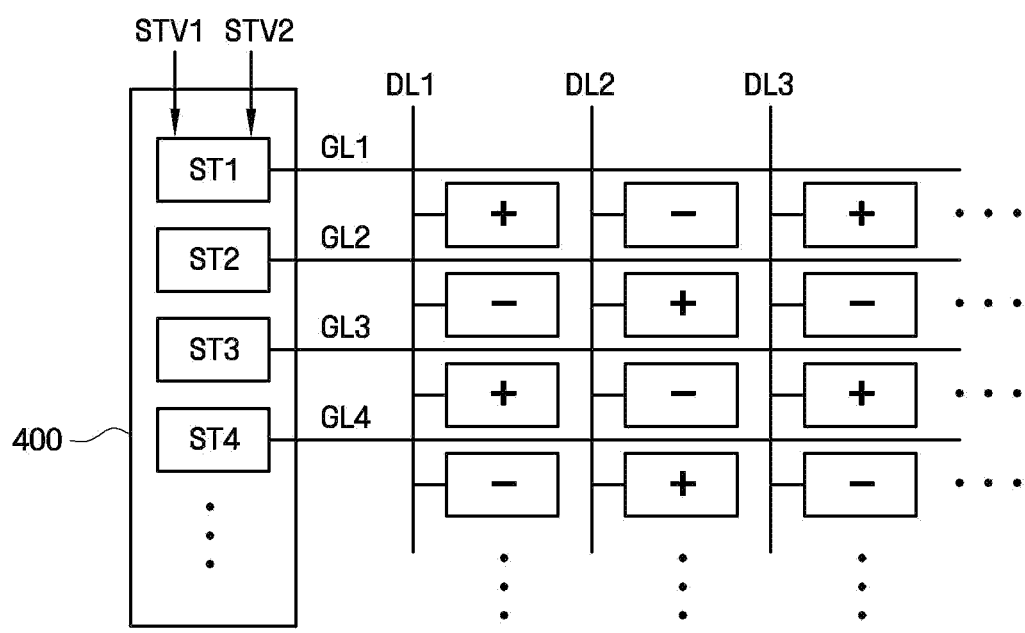
FIG. 15, FIG. 16, and FIG. 17 are schematic diagrams representing an LCD operated according to the timing diagram of FIG. 14.

Referring to FIG. 12, FIG. 14, and FIG. 15, the gate driver 400 including a plurality of stages ST1, ST2, ST3, and ST4 is enabled by a first scan start signal STV1 and a second scan start signal STV2 applied at a certain interval to sequentially output a high level of a first and second gate signal (hereinafter referred to as a first and second gate-on signal) to the gate lines GL1, GL2, GL3, and GL4. In detail, the gate driver 400 is enabled by the first scan start signal STV1 to transmit the first gate-on signal to the first gate line GL1. The gate driver 400 is enabled by the second scan start signal STV2 to transmit the second gate-on signal to the first gate line GL1. The first scan start signal STV1 and the second scan start signal STV2 have a phase difference of about 2 H. Here, 1 H is a time during which the gate-on signal is applied to and maintained at each gate line GL1, GL2, GL3, and GL4.

When the first gate-on signal is transmitted to the second gate line GL2, the first gate-off signal is transmitted to the first gate line GL1. When the second gate-on signal is transmitted to the second gate line GL2, the second gate-off signal is transmitted to the first gate line GL1. While the first and second gate-on signals are transmitted to the second gate line GL2, charges stored in the pixels which are connected to the first gate line GL1 are shared via the third TFT T3 connected to the second gate line GL2. For other gate lines, the charge-sharing process also happens by means of the same method.

The first gate-on signal transmitted to each gate line GL1, GL2, GL3, and GL4 is a signal to pre-charge the pixel connected to each gate line GL1, GL2, GL3, and GL4, and the second gate-on signal is a signal to charge the pixel connected to each gate line GL1, GL2, GL3, and GL4 with data voltage corresponding thereto.

During a first period P1 when the second gate-on signal is transmitted to the first gate line GL1, the first gate-on signal is transmitted to the third gate line GL3. That is, during the first period P1, the pixels connected to the first gate line GL1 are charged with data voltages via the data lines DL1, DL2, and DL3. At the same time, the pixels connected to the third gate line GL3 are pre-charged with the data voltages. For other gate lines, the pre-charge process also happens by means of the same method.

In this way, the charge-sharing and the pre-charging between the pixels can be easily performed using the first scan start signal STV1 and the second scan start signal STV2.

When the second gate-on signal is applied to the $i^{th}$ pixel row, the pre-charging happens in the $(i+2)^{th}$ pixel row. In addition, when the first and second gate-on signals are applied to the $(i+1)^{th}$ pixel row, the charge-sharing occurs in the $i^{th}$ pixel row.

Figure 16:
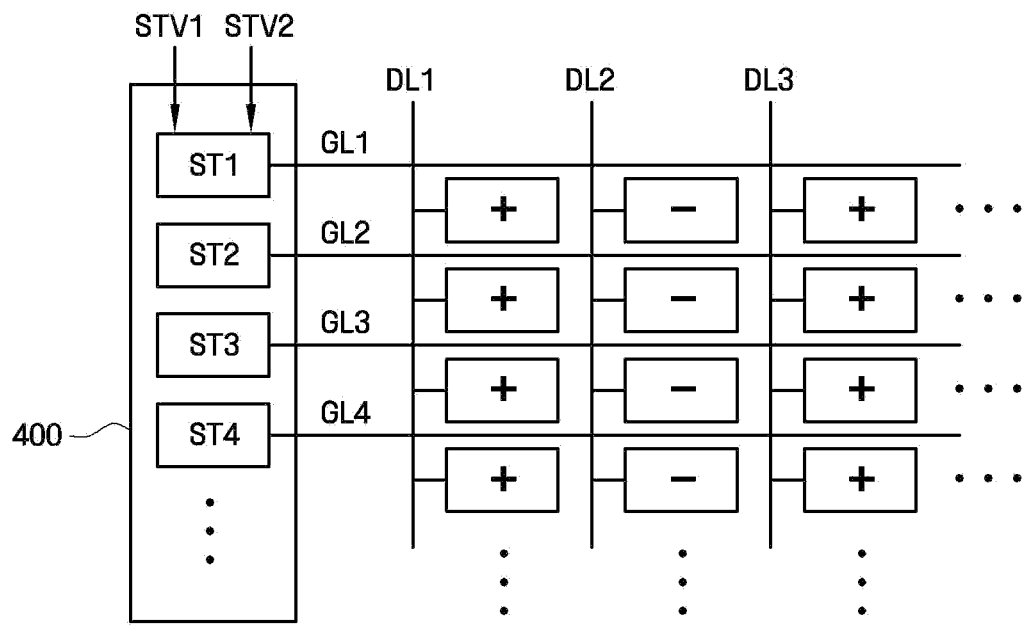
Figure 17:
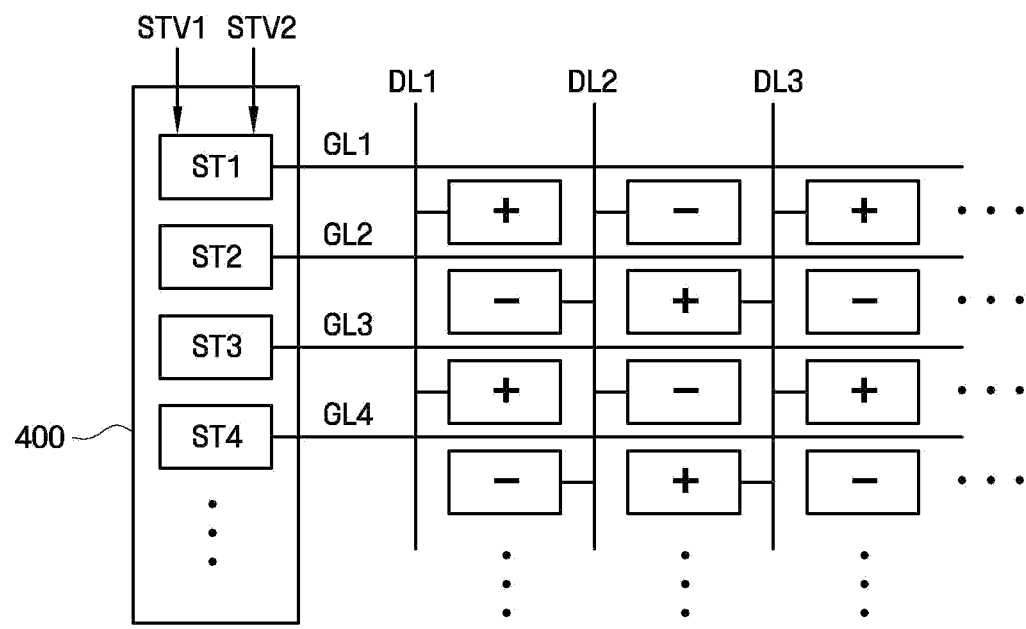

As shown in FIG. 15, because there is a phase difference between the first and second scan start signals STV1 and STV2, the dot inversion driving method may be used. In addition, as shown in FIG. 16, the column inversion driving method may be used. Further, as shown in FIG. 17, when the source electrodes branch off from each data line toward the left and right sides, respectively, the column inversion driving may have the same effect as the dot inversion driving. This is referred to as a dot-like column inversion driving method.

Figure 18:
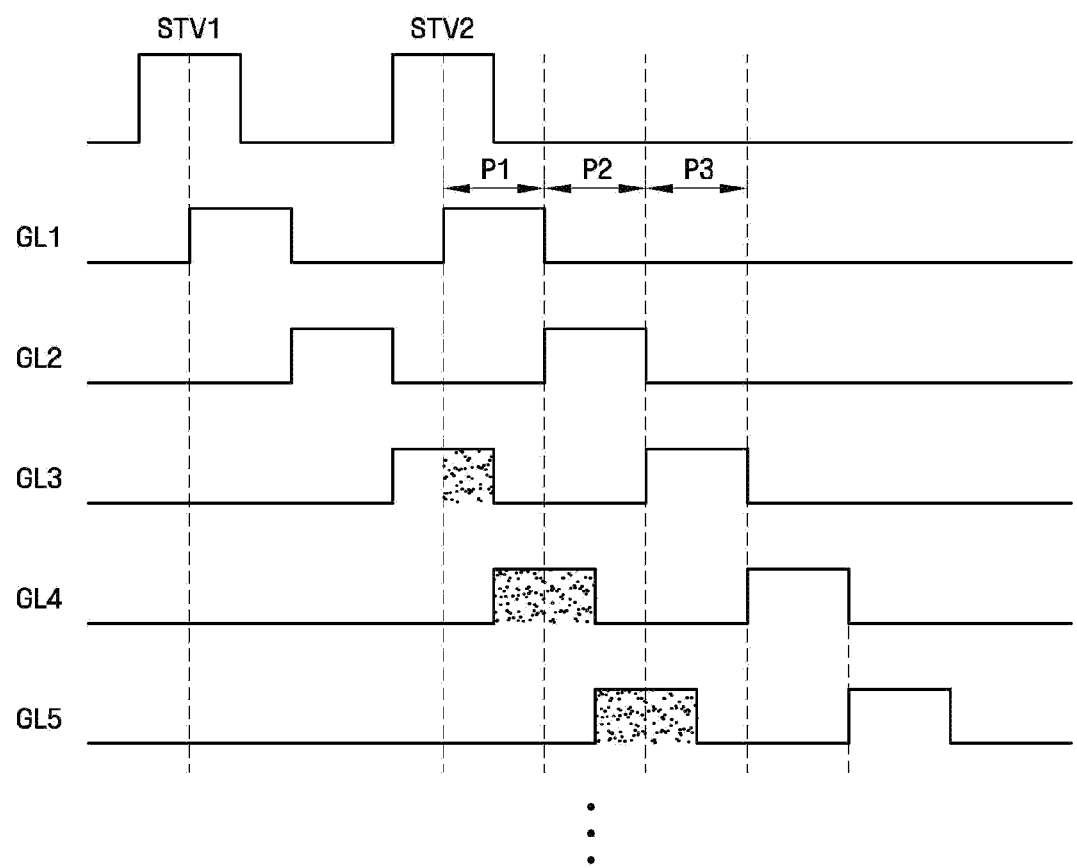
FIG. 18 is a timing diagram for representing the gate signal according to another exemplary embodiment of the present invention.

Hereinafter, a method of driving an LCD according to another exemplary embodiment of the present invention will be described in detail with reference to FIG. 18. FIG. 18 is a timing diagram representing the gate signal according to another exemplary embodiment of the present invention. Components having the same or similar function as described in connection with FIG. 14, FIG. 15, FIG. 16, and FIG. 17 of the previous exemplary embodiments are identified by the same reference numerals, and their descriptions will not be repeated. In the following, an explanation will be given in conjunction with differences between the previous and current embodiments.

The first scan start signal STV1 and the second scan start signal STV2 have a phase difference of about 2.5 H. Here, 1 H is a time during which the gate-on signal is applied to and maintained at each gate line GL1, GL2, GL3, and GL4.

When the first gate-on signal is transmitted to the second gate line GL2, the first gate-off signal is transmitted to the first gate line GL1. When the second gate-on signal is transmitted to the second gate line GL2, the second gate-off signal is transmitted to the first gate line GL1. While the first and second gate-on signals are transmitted to the second gate line GL2, charges stored in the pixels that are connected to the first gate line GL1 are shared via the third TFT T3 connected to the second gate line GL2. For other gate lines, the charge-sharing process occurs in the same manner.

The first gate-on signal transmitted to each gate line GL1, GL2, GL3, and GL4 is a signal for pre-charging the pixel connected to each gate line GL1, GL2, GL3, and GL4, and the second gate-on signal is a signal to charge the pixel connected to each gate line GL1, GL2, GL3, and GL4 with data voltage.

During a first period P1 when the second gate-on signal is transmitted to the first gate line GL1, the first gate-on signal is transmitted to the third and fourth gate lines GL3 and GL4. That is, during the first period P1, the pixels connected to the first gate line GL1 are charged with data voltages via the data lines DL1, DL2, and DL3. At the same time, the pixels connected to the third and fourth gate lines GL3 and GL4 are pre-charged with the data voltages. For other gate lines, the pre-charge process also occurs in the same manner.

In this way, the charge-sharing and the pre-charging between the pixels may be easily performed using the first scan start signal STV1 and the second scan start signal STV2. When the second gate-on signal is applied to the $i^{th}$ pixel row, the pre-charging happens in the $(i+2)^{th}$ and $(i+3)^{th}$ pixel rows. In addition, when the first and second gate-on signals are applied to the $(i+1)^{th}$ pixel row, the charge-sharing happens in the $i^{th}$ pixel row.

Since the phase difference between the first and second scan start signals STV1 and STV2 is substantially 2.5 H, the dot inversion driving method (as shown in FIG. 16) or the dot-like column inversion driving method (as shown in FIG. 17) may be used.

Hereinafter, a method of driving an LCD according to another exemplary embodiment of the present invention will be described in detail with reference to FIG. 19 and FIG. 20. Components having the same or similar function as described in connection with FIG. 14, FIG. 15, FIG. 16, and FIG. 17 of the previous exemplary embodiment are identified by the same reference numerals, and their descriptions will not be repeated.

Figure 19:
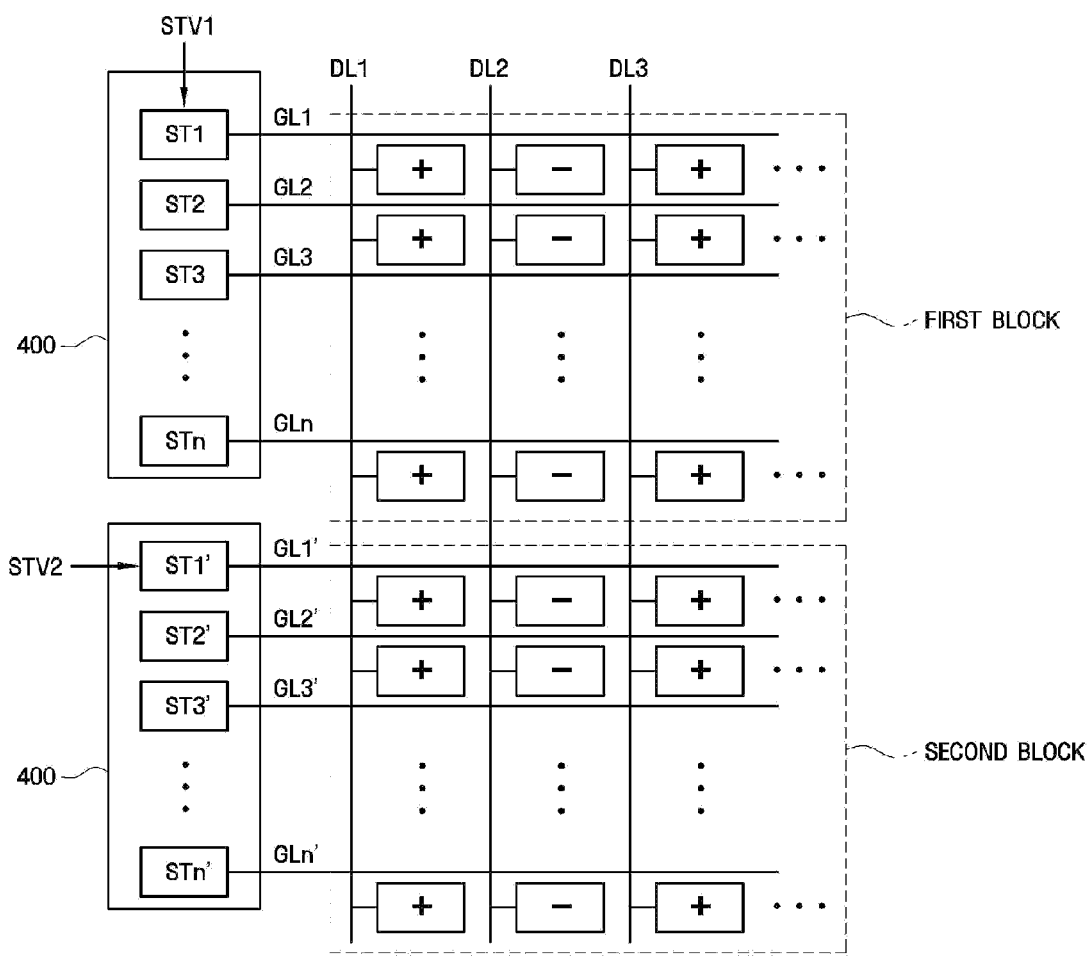
FIG. 19 is a schematic diagram representing an LCD according to another exemplary embodiment of the present invention.
Figure 20:
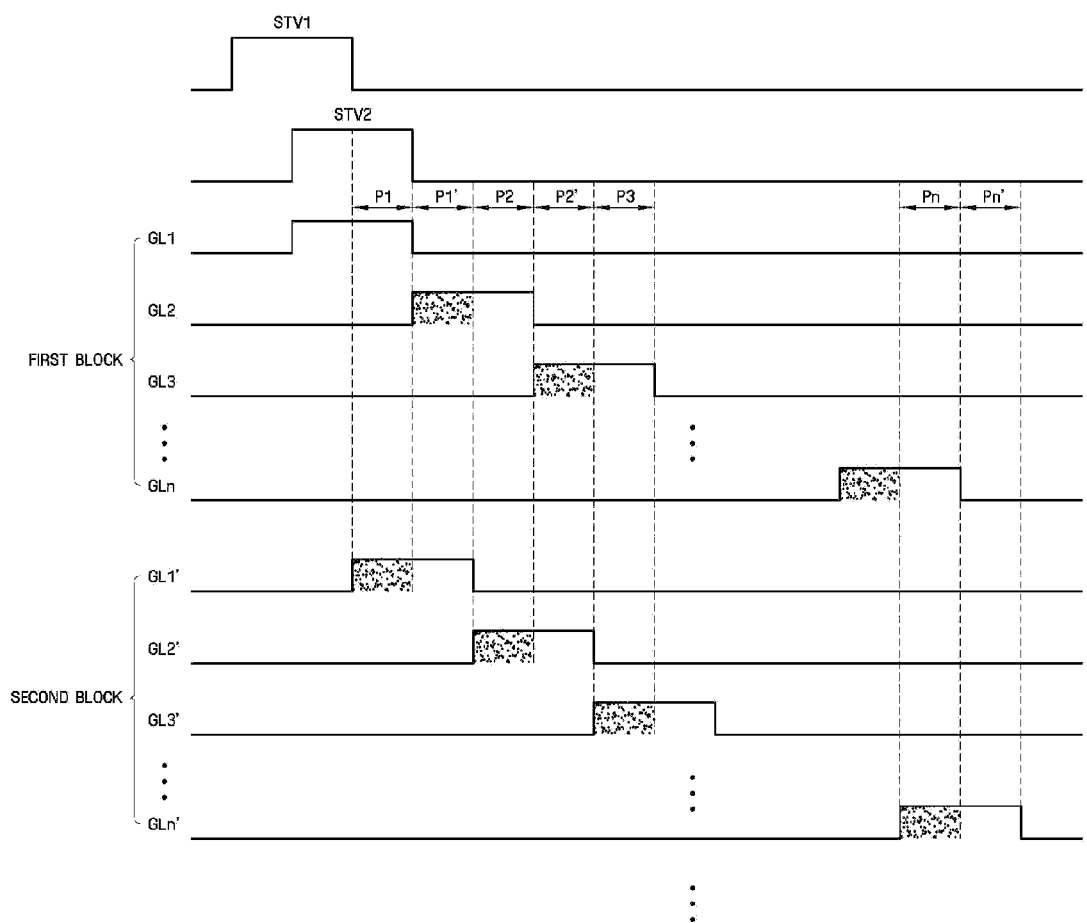
FIG. 20 is a timing diagram for representing the gate signal applied to the LCD of FIG. 19.

Referring to FIG. 19 and FIG. 20, the liquid crystal panel assembly is divided into upper and lower portions, referred to as first and second blocks, respectively. The gate driver 400 corresponding to the first block is enabled by a first scan start signal STV1 and sequentially outputs a high level of a gate signal (hereinafter referred to as a gate-on signal) to the gate lines GL1, GL2, GL3, and GL4. The gate driver 400 corresponding to the second block is enabled by a second scan start signal STV2 to sequentially output a high level of a gate signal (hereinafter referred to as a gate-on signal) to the gate lines GL1', GL2', GL3', and GL4'. The gate driver 400 is enabled by the first scan start signal STV1 to transmit the gate-on signal to the first gate line GL1 of the first block. The gate driver 400 is also enabled by the second scan start signal STV2 to transmit the gate-on signal to the first gate line GL1' of the second block. The first scan start signal STV1 and the second scan start signal STV2 have a phase difference of about 0.5 H. Here, 1 H is a time during which the gate-on signal is applied to and maintained at each of the gate lines GL1, GL2, GL3, GL4, GL1', GL2', GL3', and GL4'.

In the first block, when the gate-on signal is transmitted to the second gate line GL2, the gate-off signal is transmitted to the first gate line GL1. While the gate-on signal is transmitted to the second gate line GL2, charges stored in the pixels that are connected to the first gate line GL1 are shared via the third TFT T3 connected to the second gate line GL2.

In the second block, when the gate-on signal is transmitted to the second gate line GL2', the gate-off signal is transmitted to the first gate line GL1'. While the gate-on signal is transmitted to the second gate line GL2', charges stored in the pixels that are connected to the first gate line GL1' are shared via the third TFT T3 connected to the second gate line GL2'.

For other gate lines, the charge-sharing process also occurs in the same manner. In addition, charges stored in the pixels that are connected to the last $n^{th}$ gate line GLn of the first block may be shared when the gate-on signal is transmitted to an additional dummy gate line or to the first gate line GL1' of the second block in the next frame. In addition, charges stored in the pixels that are connected to the last $n^{th}$ gate line GLn' of the second block may be shared when the gate-on signal is transmitted to an additional dummy gate line.

A front-end of the gate-on signal transmitted to each gate line GL1, GL2, GL3, GL4, GL1', GL2', GL3', and GL4' is a signal to pre-charge the pixel connected to each gate line GL1, GL2, GL3, GL4, GL1', GL2', GL3', and GL4', and a back-end of the gate-on signal transmitted to each gate line GL1, GL2, GL3, GL4, GL1', GL2', GL3', and GL4' is a signal to charge the pixel connected to each gate line GL1, GL2, GL3, GL4, GL1', GL2', GL3', and GL4' with data voltage corresponding thereto.

During a first period P1 when the back-end of the gate-on signal is transmitted to the first gate line GL1 of the first block, the gate-on signal is transmitted to the first gate line GL1' of the second block. That is, during the first period P1, the pixels connected to the first gate line GL1 are charged with data voltages via the data lines DL1, DL2, and DL3. At the same time, the pixels connected to the first gate line GL1' are pre-charged with the data voltages.

During a first period P1' when the back-end of the gate-on signal is transmitted to the first gate line GL1' of the second block, the gate-on signal is transmitted to the second gate line GL2 of the first block. That is, during the first period P1', the pixels connected to the first gate line GL1' are charged with data voltages via the data lines DL1, DL2, and DL3. At the same time, the pixels connected to the second gate line GL2 are pre-charged with the data voltages.

For other gate lines, the pre-charge process may occur in the same manner.

In this way, the charge-sharing and the pre-charging between the pixels may be easily performed by using the first scan start signal STV1 and the second scan start signal STV2.

When the back-end of the gate-on signal is applied to the $i^{th}$ pixel row of the first block, the pre-charging happens in the $i'^{th}$ pixel row of the second block. When the back-end of the gate-on signal is applied to the $i'^{th}$ pixel row of the second block, the pre-charging happens in the $(i+1)^{th}$ pixel row of the first block. In addition, when the gate-on signal is applied to the $(i+1)^{th}$ pixel row of the first block, the charging-sharing occurs in the $i^{th}$ pixel row. When the gate-on signal is applied to the $(i+1)'^{th}$ pixel row of the second block, the charging-sharing occurs in the $i'^{th}$ pixel row.

Since the phase difference between the first and second scan start signals STV1 and STV2 is substantially 0.5 H, the dot inversion driving method (as shown in FIG. 16) or the dot-like column inversion driving method (as shown in FIG. 17) may be used.

In an exemplary embodiment, the liquid crystal panel assembly is divided into two blocks. However, the present invention is not limited thereto. The liquid crystal panel assembly may be divided into two or more blocks.

According to exemplary embodiments of the present invention, it may be possible to improve lateral visibility by dividing a pixel electrode into a pair of sub-pixel electrodes and changing the data voltages applied to each sub-pixel electrode through a charge-sharing process. In addition, the pixel has a substantially rectangular shape having a transverse length longer than a longitudinal length, which may reduce the number of data lines and data driving chips and decrease production costs. Sufficient time to drive the LCD may be obtained using the pre-charging process even if the number of gate lines increases.

It will be apparent to those skilled in the art that various modifications and variations can be made in the present invention without departing from the spirit or scope of the invention. Thus, it is intended that the present invention provided they come within the scope of the appended claims and their equivalents.

What is claimed is:

1. A method of driving a liquid crystal display (LCD), comprising:
supplying a first scan start signal and a second scan start signal that have a phase difference;
sequentially outputting a first gate-on signal and a second gate-on signal to a plurality of gate lines, the first gate-on signal and the second gate-on signal enabled by the first scan start signal and the second scan start signal, respectively;
pre-charging a pixel electrode connected to each gate line, the pixel electrode comprising a pair of sub-pixel electrodes;
charging the pair of sub-pixel electrodes with a data voltage; and
sharing the data voltage so that each sub-pixel electrode of the pair of the sub-pixel electrodes has a different voltage,
wherein the sub-pixel electrodes of the pair of sub-pixel electrodes are respectively electrically connected to a first transistor and a second transistor, the first and second transistors being electrically connected to a first gate line, and
wherein at least one of a drain electrode of the first transistor and a drain electrode of the second transistor are electrically connected to the source electrode of a third transistor, the third transistor being electrically connected to a third gate line disposed adjacent to a second gate line that is disposed adjacent the first gate line, the second gate line disposed between the first gate line and the third gate line.

2. The method of claim 1, wherein 1 H is a time during which the first gate-on signal and the second gate-on signal are applied to the gate lines, and
wherein the first scan start signal and the second scan start signal have a phase difference of 2 H.

3. The method of claim 1, wherein 1 H is a time during which the first gate-on signal and the second gate-on signal are applied to the gate lines, and
wherein the first scan start signal and the second scan start signal have a phase difference of 2.5 H.

4. The method of claim 1, wherein the LCD is divided into a first block and a second block,
wherein the first gate-on signal is sequentially applied to gate lines in the first block, and
wherein the second gate-on signal is sequentially applied to gate lines in the second block.

5. The method of claim 4, wherein 1 H is a time during which the first gate-on signal and the second gate-on signal are applied to the gate lines, and
wherein the first scan start signal and the second scan start signal have a phase difference of 0.5 H.

6. A method of driving a liquid crystal display (LCD), comprising:
supplying a first scan start signal and a second scan start signal that have a phase difference;
sequentially outputting a first gate-on signal and a second gate-on signal to a plurality of gate lines, the first gate-on signal and the second gate-on signal enabled by the first scan start signal and the second scan start signal, respectively;
pre-charging a pixel electrode connected to each gate line, the pixel electrode comprising a pair of sub-pixel electrodes;
charging the pair of sub-pixel electrodes with a data voltage; and
sharing the data voltage so that each sub-pixel electrode of the pair of the sub-pixel electrodes has a different voltage,
wherein the sub-pixel electrodes of the pair of sub-pixel electrodes are respectively electrically connected to a first transistor and a second transistor, the first and second transistors being electrically connected to a first gate line, and
wherein a drain electrode of the first transistor is electrically connected to a drain electrode of a third transistor via a single capacitor, a drain electrode of the second transistor is electrically connected directly to a source electrode of the third transistor, and a gate electrode of the third transistor being electrically connected to a second gate line different from the first gate line.

7. The method of claim 6, wherein 1 H is a time during which the first gate-on signal and the second gate-on signal are applied to the gate lines, and
wherein the first scan start signal and the second scan start signal have a phase difference of 2 H.

8. The method of claim 6, wherein 1 H is a time during which the first gate-on signal and the second gate-on signal are applied to the gate lines, and
wherein the first scan start signal and the second scan start signal have a phase difference of 2.5 H.

9. The method of claim 6, wherein the LCD is divided into a first block and a second block,
wherein the first gate-on signal is sequentially applied to gate lines in the first block, and
wherein the second gate-on signal is sequentially applied to gate lines in the second block.

10. The method of claim 9, wherein 1 H is a time during which the first gate-on signal and the second gate-on signal are applied to the gate lines, and
wherein the first scan start signal and the second scan start signal have a phase difference of 0.5 H.

* * * * *